(12) United States Patent  
Takeuchi et al.

(10) Patent No.: US 9,136,334 B2  
(45) Date of Patent: Sep. 15, 2015

(54) HIGH MOBILITY ELECTRON TRANSISTOR

(75) Inventors: Katsuhiko Takeuchi, Kanagawa (JP); Satoshi Taniguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 81 days.

(21) Appl. No.: 13/555,564

(22) Filed: Jul. 23, 2012

(65) Prior Publication Data

US 2013/0062664 A1 Mar. 14, 2013

(30) Foreign Application Priority Data

Jul. 28, 2011 (JP) ................................. 2011-165873  
Jun. 1, 2012 (JP) ................................. 2012-126040

(51) Int. Cl.  
*H01L 29/66* (2006.01)  
*H01L 29/10* (2006.01)  
*H01L 29/778* (2006.01)  
*H01L 29/80* (2006.01)  
*H01L 29/51* (2006.01)

(52) U.S. Cl.  
CPC ........ *H01L 29/1066* (2013.01); *H01L 29/7785* (2013.01); *H01L 29/802* (2013.01); *H01L 29/517* (2013.01)

(58) Field of Classification Search  
CPC .. H01L 29/778; H01L 29/7785; H01L 29/802  
USPC ........................................................ 257/194  
See application file for complete search history.

(56) References Cited

U.S. PATENT DOCUMENTS 6,365,925 B2 4/2002 Hase et al.  
2005/0167698 A1* 8/2005 Hisaka .......................... 257/194

FOREIGN PATENT DOCUMENTS

JP 11-150264 6/1999

* cited by examiner

*Primary Examiner* — Ajay K Arora  
(74) *Attorney, Agent, or Firm* — Fishman Stewart Yamaguchi PLLC

(57) ABSTRACT

A semiconductor device includes: a channel layer made of a compound semiconductor; a barrier layer provided above the channel layer and made of a compound semiconductor in which an energy band on a carrier travel side in a junction with respect to the channel layer is farther from an intrinsic Fermi level in the channel layer than in the channel layer; a low-resistance region provided in a surface layer of the barrier layer, in which resistance is kept lower than portions around by containing impurity; a source electrode and a drain electrode connected to the barrier layer at positions sandwiching the low-resistance region; a gate insulating layer provided on the low-resistance region; and a gate electrode provided above the low-resistance region through the gate insulating layer.

20 Claims, 19 Drawing Sheets

HIGH MOBILITY ELECTRON TRANSISTOR

FIELD

The present disclosure relates to a semiconductor device and a manufacturing method of the semiconductor device, and particularly relates to a semiconductor device and a manufacturing method of the semiconductor device including a low-resistance region in a barrier layer between a gate electrode and a channel layer.

BACKGROUND

It is strongly requested in recent years that portable communication terminals are miniaturized and power consumption thereof is reduced in mobile communication systems of a cellular phone and the like. In order to realize the above, for example, an on-resistance Ron should be reduced concerning an antenna switch. As one of semiconductor devices in practical use for the antenna switch, there is a junction field-effect transistor (JPHEMT: junction pseudo-morphic high electron mobility transistor).

JPHEMT is a semiconductor device performing current modulation by using a p-n junction and a hetero junction. The semiconductor device of this type has the hetero junction of a channel layer made of, for example, InGaAs and a barrier layer (AlGaAs) made of AlGaAs having a wider bandgap than the channel layer (InGaAs). A low-resistance region including an impurity is provided in a surface layer in the barrier layer (AlGaAs) opposite to the channel layer, and a gate electrode is connected to the low-resistance region. A source electrode and a drain electrode are Ohmic-connected on the barrier layer at both sides of the low-resistance region and the gate electrode.

In the semiconductor device having the above structure, a two-dimensional electron gas layer in which electrons to be carriers are shut with high concentration is formed in an interface on the barrier layer's side in the channel layer. Then, current flowing between the source electrode and the drain electrode is modulated through a channel-layer portion below the low-resistance region by controlling the concentration of the two-dimensional electron gas layer using a gate voltage (see, for example, JP-A-11-150264 (Patent Document 1)).

SUMMARY

In the above semiconductor device, mobility of carriers (electrons) flowing between the source electrode and the drain electrode can be increased through the channel layer by reducing the impurity concentration in the channel layer. However, as the p-n junction is formed by providing the low-resistance region in the barrier layer, forward current flows in the p-n junction when a positive voltage exceeding a built-in voltage is applied, which increases gate leakage current flowing between the gate electrode and the source electrode/drain electrode not through the channel layer.

In view of the above, it is desirable to provide a semiconductor device capable of improving the maximum value of drain current by preventing gate leakage current in the structure in which the low-resistance region is provided in the barrier layer formed between the gate electrode and the channel layer. It is also desirable to provide a manufacturing method of the semiconductor device.

An embodiment of the present disclosure is directed to a semiconductor device including a channel layer made of a compound semiconductor, a barrier layer provided above the channel layer and made of a compound semiconductor in which an energy band on a carrier travel side in a junction with respect to the channel layer is farther from an intrinsic Fermi level in the channel layer than in the channel layer, a low-resistance region provided in a surface layer of the barrier layer, in which resistance is kept lower than portions around by containing impurity, a source electrode and a drain electrode connected to the barrier layer at positions sandwiching the low-resistance region, a gate insulating layer provided on the low-resistance region, and a gate electrode provided above the low-resistance region through the gate insulating layer.

In the semiconductor device having the above structure, a two-dimensional electron gas layer in which carriers are shut with high concentration is formed in the channel layer as the barrier layer made of a compound semiconductor in which the energy band on the carrier travel side in the junction with respect to the channel layer is farther from the intrinsic Fermi level in the channel layer than in the channel layer is bonded to the channel layer. A carrier depletion region in a portion of the channel layer corresponding to the low-resistance region below the gate electrode is expanded or contracted according to a gate voltage applied on the gate electrode, thereby modulating current flowing between the source electrode and the drain electrode through the channel layer. Particularly, the structure in which the gate electrode is provided above the low-resistance region through the gate insulating layer is characteristic. According to the structure, it is possible to prevent gate leakage current from flowing between the gate electrode and the source electrode/drain electrode even when forward voltage with respect to the low-resistance region and surrounding regions is applied to the gate electrode.

Another embodiment of the present disclosure is directed to a manufacturing method of a semiconductor device including forming a barrier layer above a channel layer made of a compound semiconductor, which is made of a compound semiconductor in which an energy band on a carrier travel side in a junction with respect to the channel layer is farther from an intrinsic Fermi level in the channel layer than in the channel layer and which includes a low-resistance region containing an impurity in a surface layer, forming a source electrode and a drain electrode at respective positions sandwiching the low-resistance region on the barrier layer, forming a gate insulating layer on the low-resistance region and forming a gate electrode above the low-resistance region through the gate insulating layer.

The semiconductor device having the above structure can be obtained by the above manufacturing method.

According to the embodiments of the present disclosure, it is possible to improve the maximum value of drain current by preventing gate leakage current in the semiconductor device having the structure in which the low-resistance region is provided in the barrier layer between the gate electrode and the channel layer.

DETAILED DESCRIPTION

Hereinafter, embodiments of the present disclosure will be explained with reference to the drawings in the order shown below.

1. First Embodiment (Structure example of a semiconductor device and a manufacturing method)
2. Second Embodiment (Example in which the barrier layer has a stacked structure)
3. Third Embodiment (Example in which barrier layers are all formed as high-resistance regions)
4. Fourth Embodiment (Example in which the carrier supply region in the barrier layer touches the low-resistance region)
5. Fifth Embodiment (Example in which a region between the carrier supply region and the low-resistance region in the barrier layer is formed as a low-resistance region)
6. Sixth Embodiment (Example in which a cap layer is provided between the barrier layer and the source electrode/drain electrode)
7. Seventh Embodiment (Example in which the whole surface of the barrier layer is covered with the gate insulating layer)
8. Eighth Embodiment (Example in which the low-resistance region is covered with the gate electrode)
9. Ninth Embodiment (Example in which the low-resistance region is stacked on the barrier layer)
10. Tenth Embodiment (Example in which source region/drain region of a conductive type reverse to the low-resistance region is provided)
11. Modification Example
12. Application Example (Wireless Communication Device)

The same numerals and signs are given to components common to respective embodiments and repeated explanation is omitted.

1. First Embodiment

In a first embodiment, explanation will be made with reference to respective drawings in the following order: a structure of a semiconductor device according to the first embodiment to which the present disclosure is applied, an operation of the semiconductor device according to the first embodiment, a manufacturing method of the semiconductor device according to the first embodiment and advantages of the semiconductor device according to the first embodiment.

<Structure of Semiconductor Device in First Embodiment>

Figure 1:
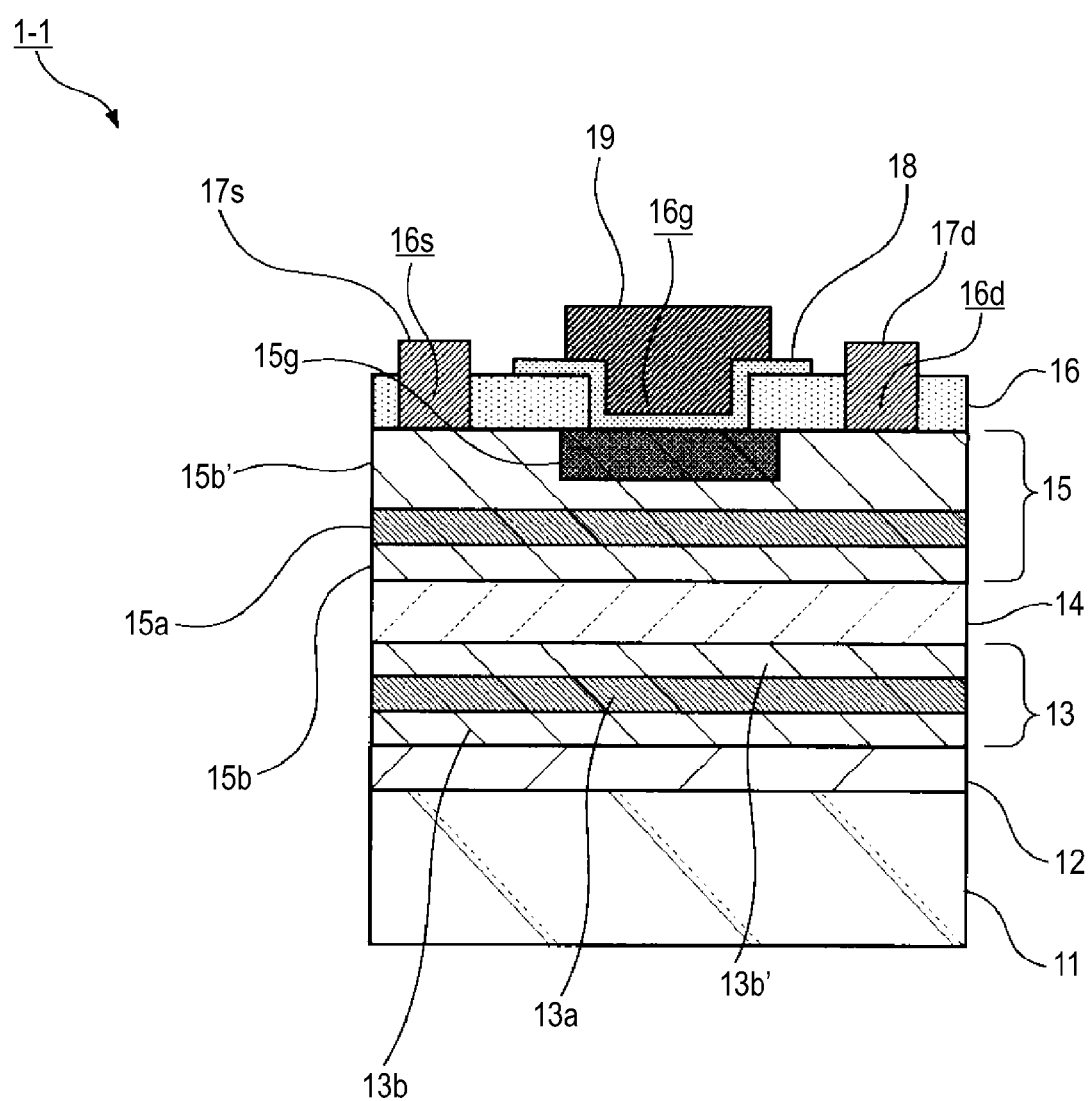
FIG. 1 is a cross-sectional view showing a structure of a relevant part of a semiconductor device according to a first embodiment.

FIG. 1 is a cross-sectional view showing a structure of a relevant part of the semiconductor device according to the first embodiment to which the present disclosure is applied. The detailed structure of the semiconductor device according to the first embodiment will be explained below with reference to the drawing.

A semiconductor device 1-1 according to the first embodiment shown in FIG. 1 is a so-called JPHEMT in which a barrier layer is provided between a gate electrode and a channel layer as well as a reverse-conductive type low-resistance region is provided in the barrier layer. In the semiconductor device 1-1, a buffer layer 12, a lower barrier layer 13, a channel layer 14 and an upper barrier layer 15 which are made of respective compound semiconductor materials are stacked in this order on a substrate 11 made of a compound semiconductor material. A carrier supply region 13a is provided in the lower barrier layer 13. On the other hand, a carrier supply region 15a and a low-resistance region 15g are provided in the upper barrier layer 15.

An insulating layer 16 is provided on a stacked body of respective layers made of compound semiconductor materials as described above. In the insulating layer 16, there are provided a source opening 16s and a drain opening 16d as well as a gate opening 16g is provided therebetween. Also on the insulating layer 16, a source electrode 17s and a drain electrode 17d connected to the upper barrier layer 15 through the source opening 16s and the drain opening 16d are provided.

Particularly, the first embodiment is characterized in that a gate electrode 19 is provided above the low-resistance region 15g exposed at a bottom portion of the gate opening 16g through a gate insulating layer 18.

Detailed structures of respective components included in the semiconductor device 1-1 will be sequentially explained from the substrate 11.
[Substrate 11]

The substrate 11 is made of a semi-insulating compound semiconductor material. The substrate 11 is made of, for example, a III-V group compound semiconductor material. For example, a semi-insulating single-crystal GaAs substrate or an InP substrate is used.

[Buffer Layer 12]

The buffer layer 12 is formed by a compound semiconductor layer obtained by, for example, performing epitaxial growth on the substrate 11, which is made of a compound semiconductor having good lattice matching with the substrate 11 and the lower barrier layer 13. When the substrate 11 is made of a single-crystal GaAs substrate, a u-GaAs epitaxial growth layer with no impurity addition ("u-" represents that an impurity is not added) is used as an example of the buffer layer 12.

[Lower Barrier Layer 13]

The lower barrier layer 13 is formed by using a compound semiconductor having good lattice matching with the buffer layer 12 and the upper channel layer 14. As an example of the lower barrier layer 13, an epitaxial growth layer of AlGaAs mixed crystal is used. In this case, the lower barrier layer 13 is made of $Al_{0.2}Ga_{0.8}As$ mixed crystal in which a composition ratio of aluminum (Al) in III-group elements is 0.2 as an example.

The above lower barrier layer 13 includes the carrier supply region 13a containing impurity supplying carriers. In this case, electrons are used as carriers, and the n-type carrier supply region 13a including an n-type impurity as the impurity supplying electrons is arranged at an intermediate layer in a film thickness direction of the lower barrier layer 13. As an n-type impurity in the lower barrier layer 13 made of $Al_{0.2}Ga_{0.8}As$ mixed crystal, silicon (Si) is used.

Film thickness portions other than the carrier supply region 13a in the lower barrier layer 13 can be formed as high-resistance regions 13b and 13b' to which no impurity is added or in which a low-concentration n-type impurity or p-type impurity is contained. These high-resistance regions 13b and 13b' preferably have an impurity concentration of $1 \times 10^{17}/cm^3$ or less and a resistivity of $1 \times 10^{-2}$ Ωcm or more.

A specific structure example of the lower barrier layer is as follows. The high-resistance region 13b not containing an impurity is provided on the buffer layer 12 with a film thickness of approximately 200 nm. The carrier supply region 13a containing silicon (Si) of approximately $1.6 \times 10^{12}/cm^2$ is stacked over the high-resistance region 13b with a film thickness of approximately 4 nm. The high-resistance region 13b' not containing an impurity is further stacked over the carrier supply region 13a with a film thickness of approximately 2 nm.

It is also preferable that the lower barrier layer 13 does not include the high-resistance regions 13b and 13b' and that the whole region of the lower barrier layer 13 is formed as the carrier supply region 13a.

[Channel Layer 14]

The channel layer 14 is a current path between the source electrode 17s and the drain electrode 17d, which is the layer in which carriers supplied from the carrier supply region 13a on the lower barrier layer 13 and the carrier supply region 15a of the upper barrier layer 15 which will be described later are accumulated. The channel layer 14 is made of a compound semiconductor which is hetero-connected to the lower barrier layer 13 and has good lattice matching with the lower barrier layer 13. The channel layer 14 is formed by using a compound semiconductor in which an energy band on a carrier travel side in a hetero junction with respect to the lower barrier layer 13 is closer to an intrinsic Fermi level in the channel layer than an energy band on a carrier travel side in a compound semiconductor material forming an interface region of the lower barrier layer 13. Accordingly, the lower barrier layer 13 is made of a compound semiconductor in which an energy band on the carrier travel side in the junction with respect to the channel layer 14 is farther from the intrinsic Fermi level in the channel layer than in the channel layer 14.

Addition 1

Figure 2:
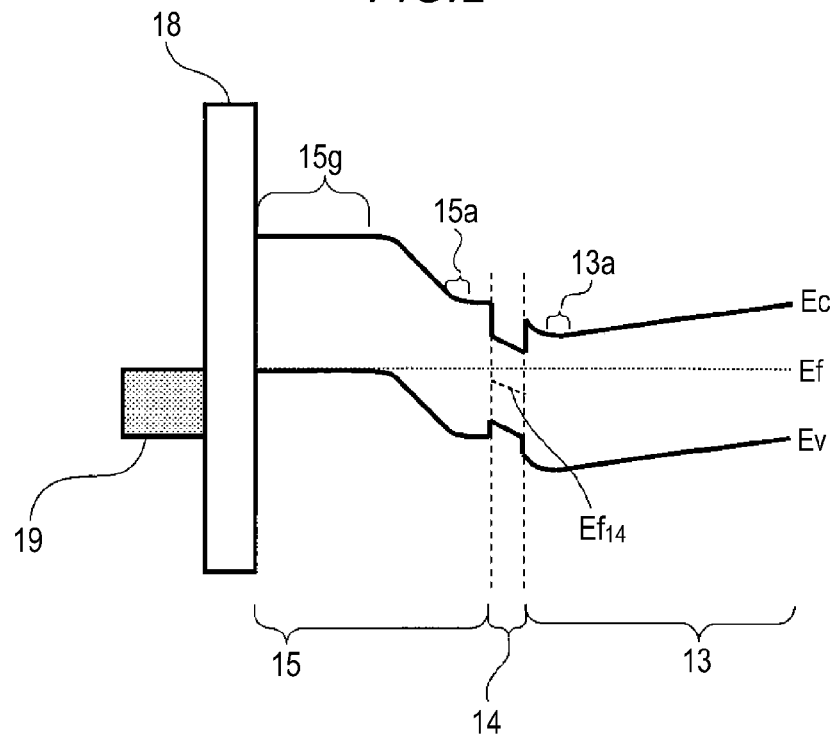
FIG. 2 is a structure chart of energy bands at the time of off-operation of the semiconductor device according to the first embodiment.

Putting the above in other words, the channel layer 14 is formed by using a compound semiconductor in which an energy band on a travel side of majority carriers in the hetero junction with respect to the lower barrier layer 13 is closer to an energy band on a travel side of minority carriers than the energy band on a travel side of majority carriers in the compound semiconductor material forming the interface region of the lower barrier layer 13. As shown in FIG. 2, an intrinsic Fermi level $Ef_{14}$ in the channel layer is positioned between the minimum energy of a conduction band (hereinafter written as a conduction band energy Ec) of the channel layer 14 and the maximum energy of a valence band (hereinafter written as a valence band energy Ev).

Addition 2

Here, in the case where carriers are electrons, the energy band on the carrier travel side is the conduction band. Accordingly, the channel layer 14 is formed by using a III-V group compound semiconductor material in which at least the conduction band energy Ec is lower than the compound semiconductor material forming the lower barrier layer 13 in the junction with respect to the lower barrier layer 13. In such channel layer 14, it is preferable that the difference in the conduction band energy Ec with respect to the lower barrier layer 13 is as large as possible in the junction with respect to the lower barrier layer 13.

Addition 3

On the other hand, in the case where carriers are holes, the energy band on the carrier side is the valance band (valence electron band). Accordingly, the channel layer 14 is formed by using a compound semiconductor material in which at least the valence band energy Ev is higher than the compound semiconductor material forming the lower barrier layer 13 in the junction with respect to the lower barrier layer 13. In such channel layer 14, it is preferable that the difference in the valence band energy Ev with respect to the lower barrier layer 13 is as large as possible in the junction with respect to the lower barrier layer 13. Though explanation will be made below by showing the case where the carriers are electrons as an example, explanation of the impurity and the energy band will be made as a reverse-conductive type when carriers are holes.

In the case where the lower barrier layer 13 is made of $Al_{0.2}Ga_{0.8}As$ mixed crystal, the above channel layer 14 is made of, for example, InGaAs mixed crystal. In this case, as a composition ratio of indium (In) is higher, the bandgap in the InGaAs mixed crystal can be narrower, therefore, the difference in the conduction band energy Ec with respect to the lower barrier layer 13 made of AlGaAs mixed crystal can be larger. Accordingly, InGaAs mixed crystal forming the channel layer 14 can have the composition ratio of indium (In) to be 0.1 or more.

The channel layer 14 described above is made of $In_{0.2}Ga_{0.8}As$ mixed crystal in which a composition ratio of indium (In) is 0.2 in III-group elements as an example. Accordingly, the channel layer 14 can obtain sufficient difference in the conduction band energy Ec while securing a lattice-matching property with respect to the lower barrier layer 13.

The above channel layer 14 can be a u-InGaAs mixed crystal layer not containing an impurity. Accordingly, impurity scattering of carriers in the channel layer 14 can be suppressed and carrier movement can be realized with high mobility.

The channel layer 14 may be an epitaxial growth layer formed to have a film thickness of 15 nm or less, which makes the layer in which crystallinity is secured and traveling property of carriers is excellent.

[Upper Barrier Layer 15]

The upper barrier layer 15 has good lattice matching with the channel layer 14. The upper barrier layer 15 is formed by using a compound semiconductor in which an energy band on the carrier travel side is farther from the intrinsic Fermi level $Ef_{14}$ in the channel layer than the compound semiconductor forming the channel layer 14 in a junction with respect to the channel layer 14. That is, the upper barrier layer 15 is formed by using a compound semiconductor in which an energy band on the travel side of majority carriers is farther from the intrinsic Fermi level in the channel layer than the compound semiconductor forming the channel layer 14 in the junction with respect to the channel layer 14. When carriers are electrons, the upper barrier layer 15 is formed by using a III-V group compound semiconductor material in which the conduction band energy Ec is higher than the compound semiconductor material forming the channel layer 14. In such upper barrier layer 15, it is preferable that the difference in the conduction band energy Ec with respect to the channel layer 14 is as large as possible in the junction with respect to the channel layer 14.

In the case where the channel layer 14 is made of InGaAs mixed crystal, the above upper barrier layer 15 is made of, for example, AlGaAs mixed crystal having a wider bandgap than InGaAs mixed crystal. In this case, the composition ratio of aluminum (Al) is kept low, thereby preventing increase of so-called source resistance as well as suppressing diffusion velocity at the time of forming the low-resistance region 15g to be explained next by diffusion and securing controllability. Accordingly, in the AlGaAs mixed crystal forming the upper barrier layer 15, the composition ratio of aluminum (Al) in III-group elements is preferably 0.25 or less.

The upper barrier layer 15 as described above is made of $Al_{0.2}Ga_{0.8}As$ mixed crystal in which the composition ratio of aluminum (Al) in III-group elements is 0.2 as an example. Accordingly, lattice matching with respect to the channel layer 14 can be secured. It is not necessary that the upper barrier layer 15 has the same composition as the lower barrier layer 13 and can be made of AlGaAs mixed crystal having compositions suitable to respective layers. For example, the composition ratio of aluminum (Al) in the upper barrier layer 15 may be set to be lower as compared with the lower barrier layer 13 in which it is not necessary to form the low-resistance region 15g by diffusion.

The upper barrier layer 15 as described above includes the carrier supply region 15a containing impurity supplying carriers. In this case, the carrier supply region 15a including silicon (Si) as an n-type impurity supplying electrons are arranged at an intermediate portion in the film thickness direction of the upper barrier layer 15 to have a film thickness of approximately 4 nm.

Film thickness portions other than the carrier supply region 15a in the upper barrier layer 15 can be formed as high-resistance regions 15b and 15b' to which no impurity is added or in which a low-concentration impurity is contained. When these high-resistance regions 15b and 15b' include the impurity, the high-resistance regions 15b provided on the channel layer 14 contains an n-type impurity or a p-type impurity. On the other hand, the high-resistance region 15b' on the opposite side of the channel layer 14, namely, the layer forming the surface side of the upper barrier layer 15 contains an n-type impurity. These high-resistance regions 15b and 15b' preferably have an impurity concentration of $1\times10^{17}/cm^3$ or less and a resistivity of $1\times10^{-2}$ Ωcm or more.

A specific structure example of the upper barrier layer is as follows. The high-resistance region 15b not containing an impurity is provided on the channel layer 14 with a film thickness of approximately 2 nm. The carrier supply region 15a containing silicon (Si) of approximately $1.6\times10^{12}/cm^2$ is stacked over the high-resistance region 15b with a film thickness of approximately 4 nm. The high-resistance region 15b' not containing an impurity is further stacked over the carrier supply region 15a with a film thickness of approximately 30 nm.

When the channel layer 14 is made of InGaAs mixed crystal, the upper barrier layer 15 is not limited to AlGaAs mixed crystal and can be made of In(AlGa)AsP mixed crystal which is a III-V group compound semiconductor. Accordingly, the composition ratio of In in the channel layer 14 made of InGaAs mixed crystal can be high and mobility of carriers in the channel layer 14 can be increased.

The upper barrier layer 15 differs from the lower barrier layer 13 in a point that the whole region of the upper barrier layer 15 is not formed as the carrier supply region.

[Low-Resistance Region 15g]

The low-resistance region 15g is provided inside the upper barrier layer 15, on the surface layer opposite to the channel layer 14 and at a shallow position on the surface side of the carrier supply region 15a in the upper barrier layer 15 at an interval with respect to the carrier supply region 15a. The low-resistance region 15g includes an impurity of a conductive type reverse to the carriers traveling in the channel layer 14 and is kept in the lower resistance than portions around. Therefore, a p-type impurity is diffused in the low-resistance region 15g when carriers are electrons.

Values of a thickness and concentration of the p-type impurity of the above low-resistance region 15g are set so that the semiconductor device 1-1 will be in the following state with values of a thickness and concentration of the n-type impurity of the high-resistance region 15b' surrounding the low-resistance region 15g. That is, these values of the thicknesses and concentration are set so that electrons in the channel layer 14 are depleted when a negative voltage is applied to the gate electrode 19 as well as the depletion occurs in low-resistance region 15g when a positive voltage is applied to the gate electrode 19.

The depletion of electrons in the channel layer 14 occurring when the negative voltage is applied to the gate electrode 19 is due to a depletion layer in a p-n junction between the low-resistance region 15g and the high-resistance region 15b' of the upper barrier layer 15. On the other hand, the depletion of the low-resistance region 15g occurring when the positive voltage is applied to the gate electrode 19 is due to a depletion layer generated by a MIS structure including the p-type low-resistance region 15g, the gate insulating layer 18 and the gate electrode 19. When the depletion occurs in the low-resistance region 15g, the depletion layer between the low-resistance region 15g and the high-resistance region 15b' disappears and the depletion of electrons in the channel layer 14 is cancelled, electrons are accumulated in the channel layer 14.

The above low-resistance region 15g may contain a p-type impurity of $1\times10^{18}/cm^3$ or more as an example, for example, $1\times10^{19}/cm^3$. As a p-type impurity in the upper barrier layer 15 made of $Al_{0.2}Ga_{0.8}As$ mixed crystal or In(AlGa)AsP mixed crystal, zinc (Zn) is used.

[Insulating layer 16]

The insulating layer 16 is provided so as to cover the whole surface of the upper barrier layer 15. The insulating layer 16 is made of a material having insulation property with respect to the compound semiconductor forming the upper barrier layer 15 as well as having a function of protecting the surface of a base (the upper barrier layer 15 in this case) from an impurity such as ion, which is for example, silicon nitride ($Si_3N_4$) with a thickness of 200 nm.

In the insulating layer 16, the source opening 16s and the drain opening 16d reaching the high-resistance region 15b' of the upper barrier layer 15 are provided at positions sandwiching the low-resistance region 15g provided in the upper barrier layer 15 and not overlapping the low-resistance region 15g. The gate opening 16g with a shape exposing the low resistance region 15g is provided between the source opening 16s and the drain opening 16d. The gate opening 16g has an opening width in which only the low-resistance region 15g is exposed at the bottom in this case as an example.

The source opening 16s, the drain opening 16d and the gate opening 16g are provided in the insulating layer 16 as opening portions independent to one another.

[Source Electrode 17s/Drain Electrode 17d]

The source electrode 17s and the drain electrode 17d are ohmic-connected to the upper barrier layer 15 through the source opening 16s and the drain opening 16d respectively at positions sandwiching the low-resistance region 15g. The source electrode 17s and the drain electrode 17d are made of an alloy of gold-germanium (AuGe), nickel (Ni) and gold (Au) which are sequentially stacked in this order from the upper barrier layer 15. Each film thickness of the source electrode 17s and the drain electrode 17d is, for example, 1000 nm respectively.

[Gate Insulating layer 18]

The gate insulating layer 18 is provided at the bottom of the gate opening 16g formed in the insulating layer 16, which may be provided so as to close the gate opening 16g completely, in which a peripheral edge is stacked over the insulating layer 16. The gate insulating layer 18 is made of an oxide or a nitride, for example, aluminum oxide ($Al_2O_3$) with a thickness of 10 nm.

[Gate Electrode 19]

The gate electrode 19 is provided above the low-resistance region 15g through the gate insulating layer 18. In this case, the gate electrode 19 is provided so as to fill in the gate opening 16g over the whole region of the bottom of the gate opening 16g above the low-resistance region 15g. The gate electrode 19 has a structure in which titanium (Ti), platinum (Pt) and gold (Au) are sequentially stacked in this order from the substrate 11.

[Band Structure]

FIG. 2 is a structure chart of energy bands below the gate electrode 19 of the semiconductor device 1-1 having the above structure at the time of off-operation in which a gate voltage Vg=approximately 0V is applied. The structure chart of energy bands indicates a case in which the lower barrier layer 13 and the upper barrier layer 15 are made of $Al_{0.2}Ga_{0.8}As$ mixed crystal respectively and the channel layer 14 is made of $In_{0.2}Ga_{0.8}As$ mixed crystal.

As shown in FIG. 2, the semiconductor device 1-1 explained by using the above FIG. 1 has the structure in which the channel layer 14 having a narrow bandgap is sandwiched between the lower barrier layer 13 and the upper barrier layer 15 having a wider bandgap than the channel layer. Therefore, the channel layer 14 will be a two-dimensional electron gas layer in which carriers are accumulated when carriers are supplied from the carrier supply regions 13a and 15a in the lower barrier layer 13 and the upper barrier layer 15.

Additionally, in the hetero junction between the channel layer 14 and the upper barrier layer 15, a discontinuous quantity ΔEc of the conduction band to be the carrier travel side is sufficiently high (0.31 eV in this case). Moreover, the semiconductor device 1-1 is configured so that the difference between the minimum point of the conduction band energy Ec in the upper barrier layer 15 and the conduction band energy Ec in the channel layer 14 is also sufficiently high (0.20 eV or more in this case). Accordingly, the number of electrons distributed in the upper barrier layer 15 is reduced to be vanishingly small as compared with the number of electrons distributed in the channel layer 14.

<Operation of Semiconductor Device in First Embodiment>

Figure 3:
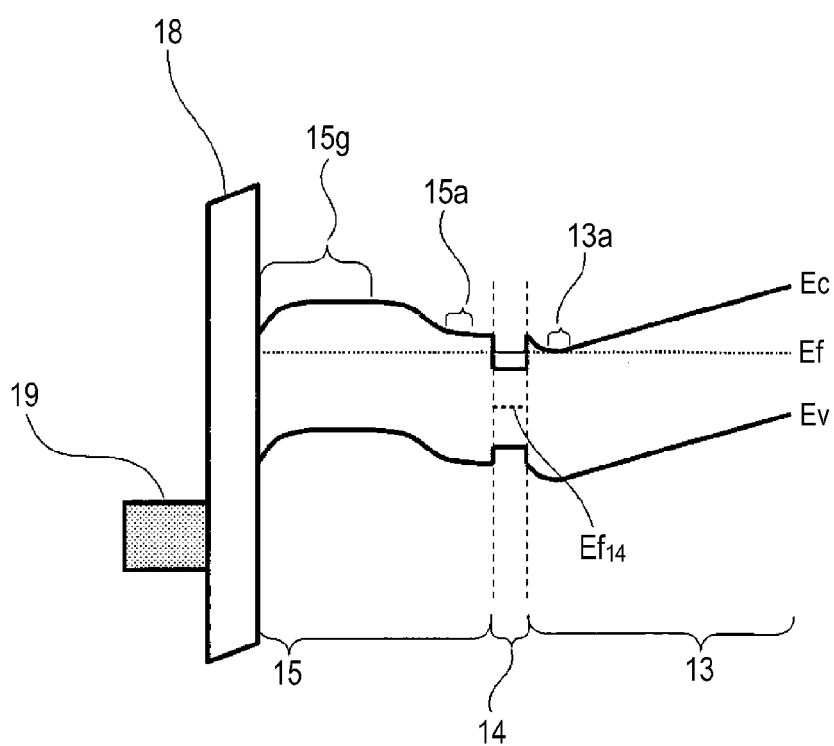
FIG. 3 is a structure chart of energy bands at the time of on-operation of the semiconductor device according to the first embodiment.

Next, the operation of the semiconductor device 1-1 having the above structure explained with reference to FIG. 1 will be explained with reference to the above FIG. 2 as well as a structure chart of energy bands of FIG. 3 and a cross-sectional view of the semiconductor device 1-1 of FIG. 4. FIG. 3 is a chart at the time of on-operation in which a gate voltage Vg=approximately 3V is applied, indicating a case in which the lower barrier layer 13 and the upper barrier layer 15 are made of $Al_{0.2}Ga_{0.8}As$ mixed crystal respectively and the channel layer 14 is made of $In_{0.2}Ga_{0.8}As$ mixed crystal in the same manner as FIG. 2.

First, referring to FIG. 1 and FIG. 2, the valence band energy Ev in the p-type low-resistance region 15g below the gate insulating layer 18 is fixed and corresponds to a Fermi level Ff in a state in which the gate voltage Vg=approximately 0V is applied to the gate electrode 19 in the semiconductor device 1-1. As hole accumulation occurs on a surface of the p-type low resistance region 15g when the gate voltage Vg is negative bias, the band shape in the vicinity of the channel layer 14 is the same as FIG. 2 though the conduction band energy Ec and the valence band energy Ev decrease in the vicinity of the surface.

Figure 4:
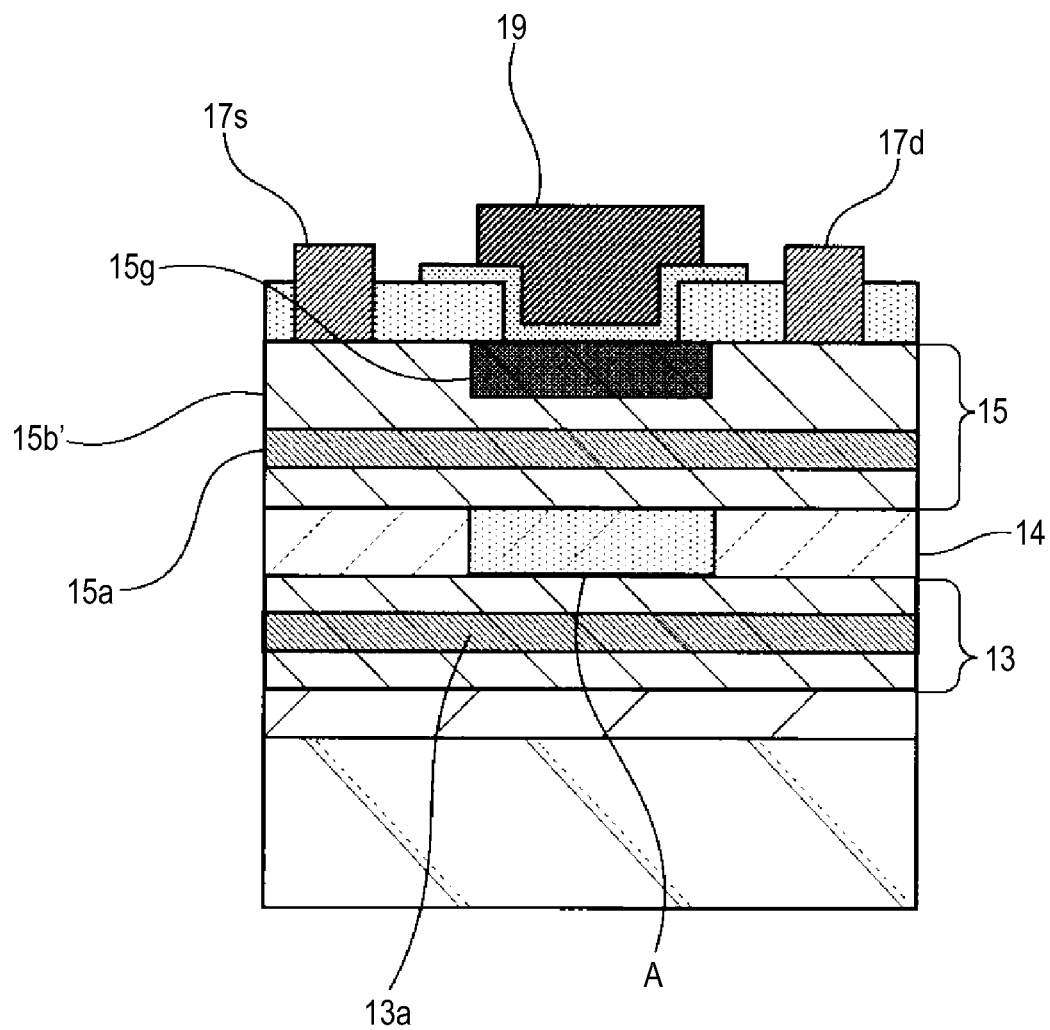
FIG. 4 is a cross-sectional view showing formation of a carrier depletion region at the time of off-operation of the semiconductor device according to the first embodiment.

In the above state, a carrier depletion region A in which electrons are depleted is formed at a region inside the channel layer 14 positioned just under the low-resistance region 15g in the semiconductor device 1-1 as shown in FIG. 4 and the channel layer 14 will be high resistance. Accordingly, a drain current Id does not flow between the source electrode 17s and the drain electrode 17d through the channel layer 14 and the device is in the off-state.

On the other hand, referring to FIG. 1 and FIG. 3, the conduction band energy Ec in the p-type low-resistance region 15g is decreased through the gate insulating layer 18 in a state in which the positive gate voltage Vg=approximately 3.0V is applied to the gate electrode 19 in the semiconductor device 1-1. Accordingly, electron holes are depleted in the low-resistance region 15g. Then, the carrier depletion region A in the channel layer 14 shown in FIG. 4 disappears and the number of electrons in the channel layer 14 is increased, therefore, the drain current Id flows between the source electrode 17s and the drain electrode 17d through the channel layer 14. The drain current Id is modulated by the gate voltage Vg.

<Manufacturing Method of Semiconductor Device in First Embodiment>

Next, an example of a manufacturing method of the semiconductor device 1-1 having the above structure will be explained based on cross-sectional process views of FIGS. 5A, 5B, FIGS. 6A and 6B.

[FIG. 5A]

Figure 5A:
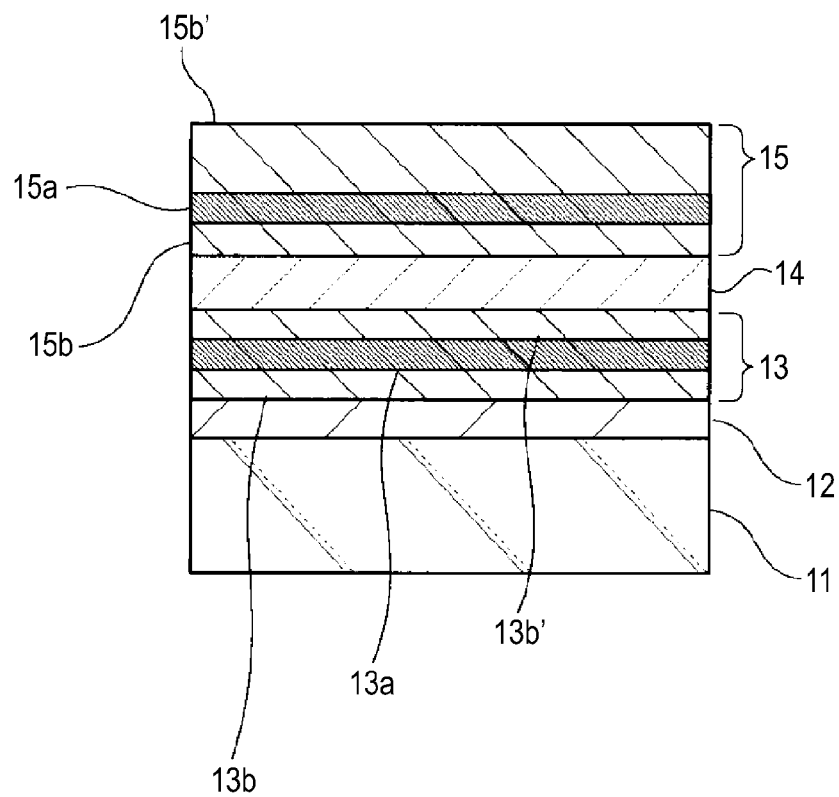
FIGS. 5A and 5B are cross-sectional process views (No. 1) showing manufacturing procedures of the semiconductor device according to the first embodiment.

First, as shown in FIG. 5A, for example, the u-GaAs layer to which no impurity is added is grown by the epitaxial technology on the substrate 11 made of, for example, GaAs to form the buffer layer 12. After that, for example, the AlGaAs ($Al_{0.2}Ga_{0.8}As$ mixed crystal) layer is grown by the epitaxial technology to thereby form the lower barrier layer 13 on the buffer layer 12. At this time, the high-resistance region 13b made of, for example, a u-AlGaAs layer to which no impurity is added, the carrier supply region 13a made of an n-type AlGaAs layer to which silicon (Si) is added and the high-resistance region 13b' made of the u-AlGaAs layer to which no impurity is added are sequentially formed by epitaxial growth. Accordingly, the lower barrier layer 13 including the n-type carrier supply region 13a at the center in the film-thickness direction is obtained.

Next, for example, the u-InGaAs layer to which no impurity is added is grown by the epitaxial technology to form the channel layer 14 over the lower barrier layer 13. The channel layer 14 is formed by using a compound semiconductor in which the energy band on the carrier travel side in the hetero junction with respect to the lower barrier layer 13 is closer to the intrinsic Fermi level in the channel layer than the energy band on the carrier travel side in a compound semiconductor material forming the lower barrier layer 13.

After that, for example, the AlGaAs ($Al_{0.2}Ga_{0.8}As$ mixed crystal) layer is grown by the epitaxial technology to form the upper barrier layer 15 on the channel layer 14. At this time, the high-resistance region 15b made of, for example, a u-AlGaAs layer to which no impurity is added, the carrier supply region 15a made of an n-type AlGaAs layer to which silicon (Si) is added and the high-resistance region 15b' made of the u-AlGaAs layer to which no impurity is added are sequentially formed by epitaxial growth. Accordingly, the upper barrier layer 15 including the n-type carrier supply region 15a at the center in the film-thickness direction is obtained. The upper barrier layer 15 is made of a compound semiconductor in which the energy band on the carrier travel side in the junction with respect to the channel layer 14 is farther from the intrinsic Fermi level in the channel layer than in the channel layer 14.

After the above process, an element isolation region not shown here is formed. In this case, a deactivated region which has become high resistance by ion implantation such as boron is formed to be the element isolation region.

[FIG. 5B]

Figure 5B:
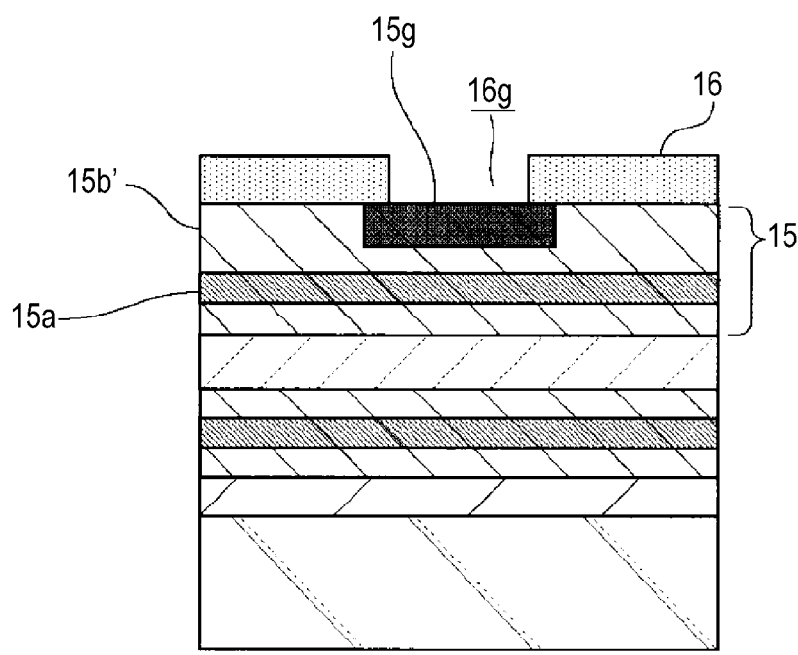

Next, as shown in FIG. 5B, the insulating layer 16 made of silicon nitride ($Si_3N_4$) is deposited on the upper barrier layer 15 using, for example, a CVD (Chemical Vapor Deposition) method. After that, the gate opening 16g exposing the surface of the upper barrier layer 15 is formed in the insulating layer 16 by pattern-etching the insulating layer 16. A p-type impurity is implanted from the surface layer of the upper barrier layer 15 exposing at the bottom of the gate opening 16g in the above state, thereby forming the low-resistance region 15g in the upper barrier layer 15. In this case, the low-resistance region 15g is formed by diffusing zinc (Zn) as the p-type impurity only in a position not reaching the carrier supply region 15a, namely, on the surface layer in the high-resistance region 15b'. The diffusion of zinc (Zn) is performed by vapor diffusion using a zinc compound gas at, for example, a temperature of approximately 600 degrees. Accordingly, the low-resistance region 15g is formed in self-alignment at the bottom of the gate opening 16g.

[FIG. 6A]

Figure 6A:
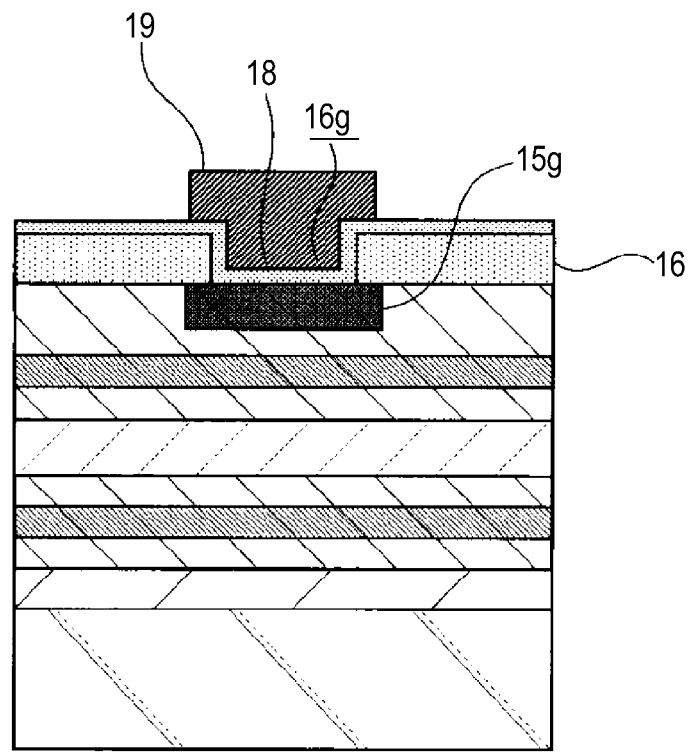
FIGS. 6A and 6B are cross-sectional process views (No. 2) showing manufacturing procedures of the semiconductor device according to the first embodiment.

Next, as shown in FIG. 6A, the gate insulating layer 18 is deposited on the insulating layer 16 so as to cover the low-resistance region 15g and an inner wall of the gate opening 16g. In this case, the gate insulating layer 18 made of aluminum oxide ($Al_2O_3$) having a film thickness of approximately 10 nm is deposited with high accuracy using, for example, an ALD (Atomic Layer Deposition) method.

After that, the gate electrode 19 having a shape of filling in the gate opening 16g is formed on the low-resistance region 15g through the gate insulating layer 18. At this time, titanium (Ti), platinum (Pt) and gold (Au) are sequentially mask-deposited on the gate insulating layer 18 to thereby form the gate electrode 19 by patterning. [FIG. 6B]

Figure 6B:
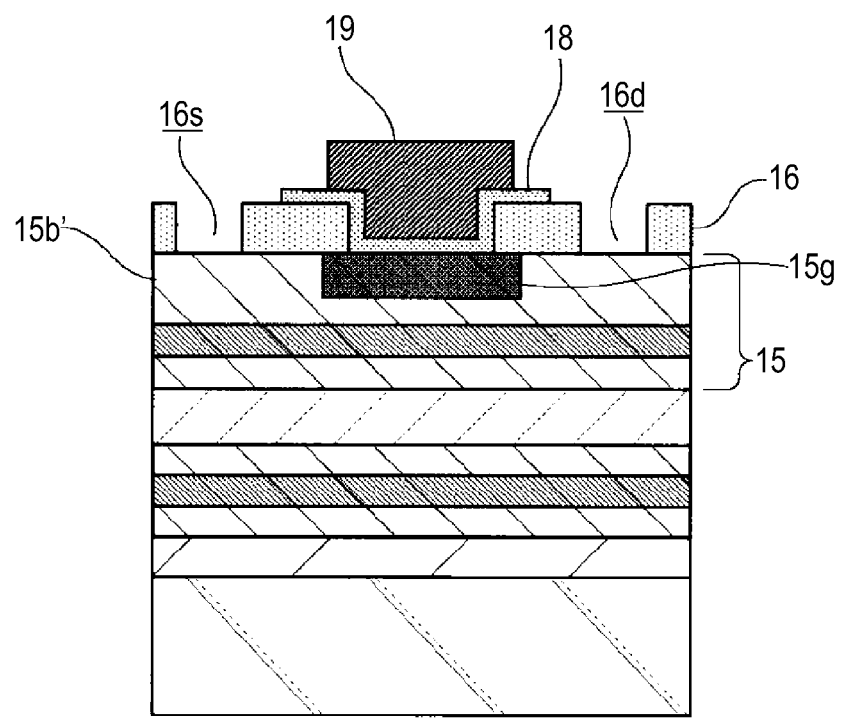

Next, as shown in FIG. 6B, the source opening 16s and the drain opening 16d in which the high-resistance region 15b' of the upper barrier layer 15 is exposed at positions sandwiching the low-resistance region 15g by pattern-etching the gate insulating layer 18 and the insulation film 16.

[FIG. 1]

Subsequently, the source electrode 17s and the drain electrode 17d which are Ohmic-connected to the high-resistance region 15b' of the upper barrier layer 15 through the source opening 16s and the drain opening 16d are formed as shown in FIG. 1. At this time, the source electrode 17s and the drain electrode 17d are formed by sequentially depositing and patterning gold-germanium (AuGe), Nickel (Ni) and gold (Au), and further, a gold-group alloy is formed by, for example, heat treatment at approximately 400 degrees to complete the semiconductor device 1-1.

The semiconductor device 1-1 according to the first embodiment can be formed by the above manufacturing method explained as the above. In the above method, after the low-resistance region 15g is formed by diffusion of the p-type impurity from the gate opening 16g formed in the insulating layer 16, the gate electrode 19 is formed through the gate insulating layer 18 so as to fill in the gate opening 16g. Accordingly, the gate electrode 19 is formed in self-alignment above the low-resistance region 15g through the gate insulating layer 18. Therefore, the semiconductor device 1-1 according to the first embodiment can be easily obtained.

The gate opening 16g, the low-resistance region 15g, the gate insulating layer 18 and the gate electrode 19 can be formed after forming the drain opening 16d/source opening 16s and the source electrode 17s/drain electrode 17d. Even in this case, the gate electrode 19 is formed in self-alignment with respect to the low-resistance region 15g through the gate insulating layer 18, therefore, the semiconductor device 1-1 according to the first embodiment can be easily obtained.

<Advantages of Semiconductor Device of First Embodiment>

The semiconductor device 1-1 explained as the above is provided with the gate electrode 19 through the gate insulating layer 18 above the p-type low-resistance region 15g provided in the n-type high-resistance region 15b' not containing an impurity or with a low concentration. Therefore, it is possible to prevent gate leakage current from flowing between the gate electrode 19 and the source electrode 17s/drain electrode 17d even when forward voltage (positive voltage in this case) is applied to the gate electrode 19. Accordingly, a higher positive gate voltage Vg can be applied to the gate electrode 19 as compared with the semiconductor device of the related-art structure (JPHEMT) in which the gate insulating layer 18 is not provided. As a result, it is possible to reduce the on-resistance Ron in the channel layer 14 to be lower, thereby improving the maximum drain current idmax. It is also possible to downsize the device and reduce parasitic capacitance with respect to the device.

The semiconductor device 1-1 is provided with the n-type carrier supply region 13a in the lower barrier layer 13 and n-type carrier supply region 15a in the upper barrier layer 15. As electrons are supplied to the channel layer 14 from the carrier supply regions 13a and 15a, the sheet carrier density in the channel layer 14 is increased and channel resistance can be reduced. Also according to the above, the on-resistance Ron can be reduced and the maximum drain current Idmax can be improved.

Additionally, in the off-operation in which the negative voltage is applied to the gate electrode 19, an electric field generated by the applied negative voltage is all applied to the gate insulating layer 18. Accordingly, the depletion layer in the layers made of compound semiconductors below the upper barrier layer 15 including the low-resistance region 15g does not change. That is, gate bias dependence of capacitance is hardly observed at the off-operation, which improves harmonic distortion characteristics.

The case where the semiconductor device 1-1 is a depression type has been explained in the first embodiment, however, the same applies to an enhancement type device, to which the above explanation is more applicable.

2. Second Embodiment

Example in which the Barrier Layer has a Stacked Structure

Figure 7:
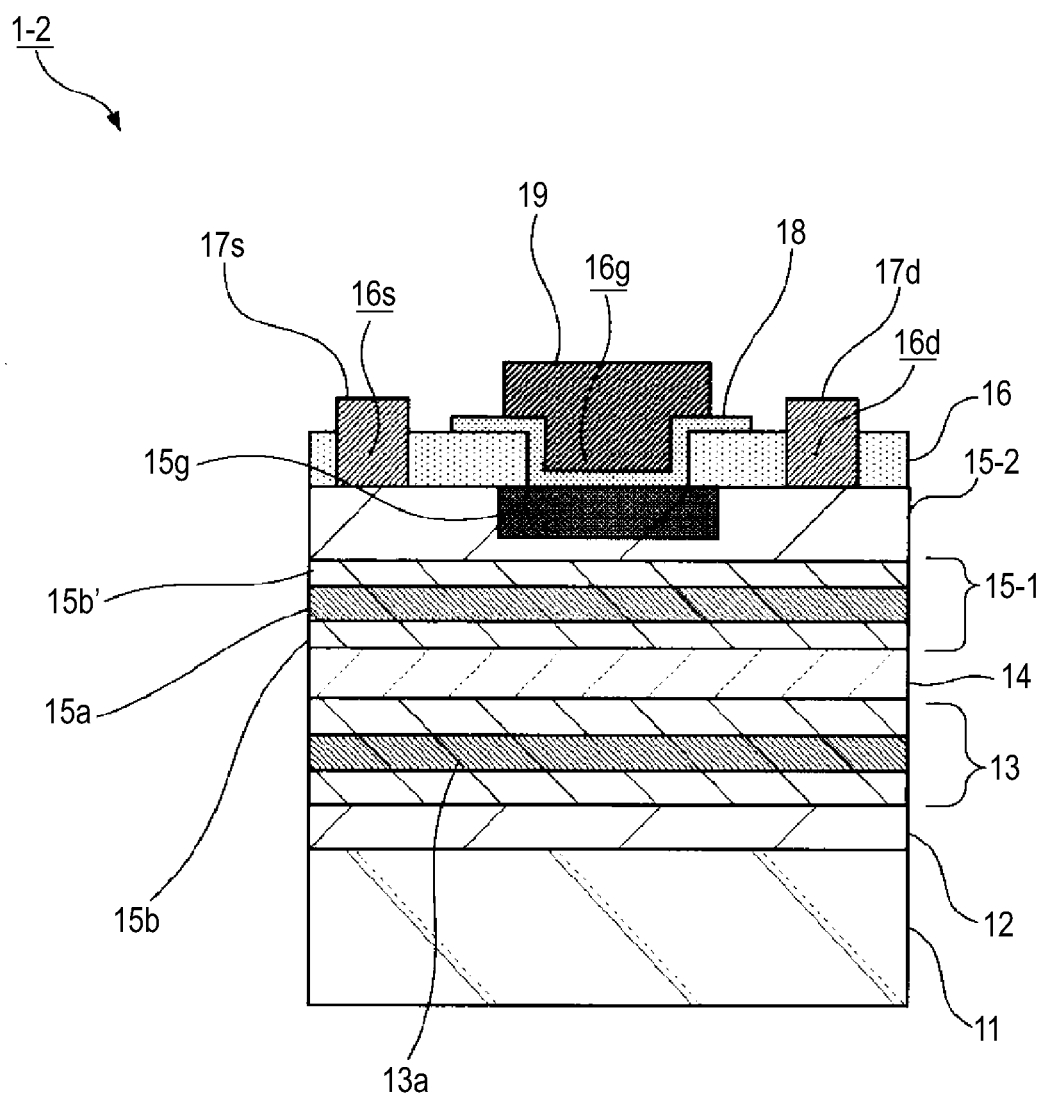
FIG. 7 is a cross-sectional view showing a structure of a relevant part of a semiconductor device according to a second embodiment.
Figure 8:
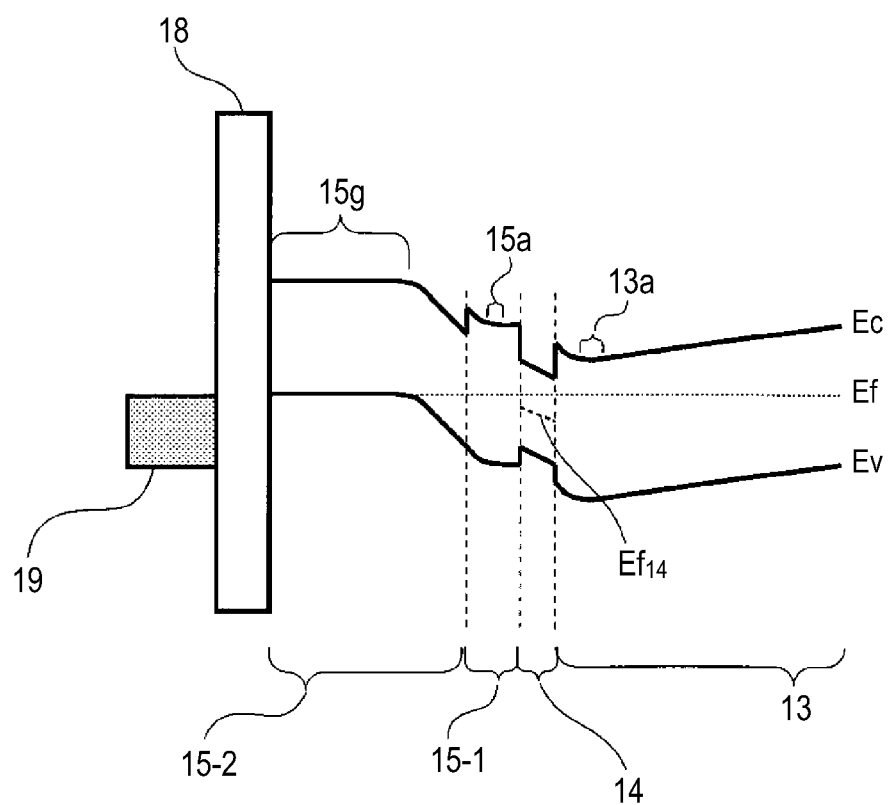
FIG. 8 is a structure chart of energy bands at the time of off-operation of the semiconductor device according to the second embodiment.

FIG. 7 is a cross-sectional view showing a structure of a relevant part of a semiconductor device according to a second embodiment and FIG. 8 is an energy band chart for explaining an operation of the semiconductor device according to the second embodiment. Hereinafter, explanation will be made with reference to these respective drawings in the following order: a structure of the semiconductor device according to the second embodiment to which the present disclosure is applied, an operation of the semiconductor device according to the second embodiment, a manufacturing method of the semiconductor device according to the second embodiment and advantages of the semiconductor device according to the second embodiment.

<Structure of Semiconductor Device in Second Embodiment>

As shown in FIG. 7, a semiconductor device 1-2 according to the second embodiment differs from the semiconductor device of the first embodiment explained with reference to FIG. 1 in a point that the upper barrier layer has a stacked structure of a first upper barrier layer 15-1 and a second upper barrier layer 15-2, and other components are the same as the first embodiment. Accordingly, the same numerals and signs are given to the same components as the first embodiment and detailed explanation is omitted in the present embodiment. Structures of the first upper barrier layer 15-1 and the second upper barrier layer 15-2 will be explained below.

[First Upper Barrier Layer 15-1]

The first upper barrier layer 15-1 is a layer provided so as to touch the channel layer 14, which can be formed in the same manner as the upper barrier layer 15 of the first embodiment. That is, the first upper barrier layer 15-1 is formed by using a semiconductor material having good lattice matching with the channel layer 14. Additionally, the first upper barrier layer 15-1 is formed by using a compound semiconductor in which the energy band on the carrier travel side is farther from the intrinsic Fermi level $Ef_{14}$ in the channel layer than the compound semiconductor material forming the channel layer 14 in the junction with respect to the channel layer 14. The above is the same as the upper barrier layer of the first embodiment, and in the case where the channel layer 14 is made of InGaAs mixed crystal, the above first upper barrier layer 15-1 is made of $Al_{0.2}Ga_{0.8}As$ mixed crystal as an example.

The first upper barrier layer 15-1 is also provided with the carrier supply region 15a in the same manner as the upper barrier layer of the first embodiment. The carrier supply region 15a has a film thickness of approximately 4 nm, which is arranged so as to include silicon (Si) of approximately $1.6 \times 10^{12}/cm^2$ as an n-type impurity at a film thickness portion ranging from a position of approximately 2 nm from the channel layer 14 to a position approximately 2 nm from the surface as an example.

The first barrier layer 15-1 differs from the upper barrier layer of the first embodiment in points that the whole region can be formed as the carrier supply region 15a and that the low-resistance region 15g is not formed in the first barrier layer 15-1.

[Second Upper Barrier Layer 15-2]

The second upper barrier layer 15-2 is a layer arranged above the channel layer 14 through the first upper barrier layer 15-1, forming the upper barrier layer together with the first upper barrier layer 15-1. The low-resistance region 15g is provided in a surface layer of the second upper barrier layer 15-2. The second upper barrier layer 15-2 is characterized by being made of a compound semiconductor material having lattice matching with the first upper barrier layer 15-1, in which diffusion velocity of an impurity contained in the low-resistance region 15g is low. It is not necessary that the bandgap of the second upper barrier layer 15-2 corresponds to the bandgap of the first upper barrier layer 15-1, and the bandgap is not particularly limited within a range not affecting characteristics of the semiconductor device 1-2.

When the first upper barrier layer 15-1 is made of AlGaAs mixed crystal, the above second upper barrier layer 15-2 is made of, for example, GaAs. Accordingly, the velocity of diffusing zinc (Zn) as a p-type impurity contained in the low-resistance region 15g into the second upper barrier layer 15-2 is suppressed, therefore, the low-resistance region 15g can be formed with higher accuracy than in the case of diffusing zinc (Zn) into AlGaAs mixed crystal forming the first upper barrier layer 15-1.

It is preferable that an impurity is not added to the second upper barrier layer 15-2 or an n-type impurity with low concentration is contained therein.

[Low-Resistance Region 15g]

The low-resistance region 15g has the same structure as the first embodiment, and the second embodiment is characterized in that the low-resistance region 15g is provided in the surface layer of the second upper barrier layer 15-2 as described above.

[Band Structure]

FIG. 8 is a structure chart of energy bands of the semiconductor device 1-2 having the above structure at the time of off-operation in which a gate voltage Vg=approximately 0V is applied. The structure chart of energy bands indicates a case in which the lower barrier layer 13 and the first upper barrier layer 15-1 are made of $Al_{0.2}Ga_{0.8}As$ mixed crystal respectively, the second upper barrier layer 15-2 is made of GaAs mixed crystal and the channel layer 14 is made of $In_{0.2}Ga_{0.8}As$ mixed crystal.

As shown in FIG. 8, the semiconductor device 1-2 configured as the above has also the same structure as the semiconductor device of the first embodiment, in which the channel layer 14 with the narrow bandgap is sandwiched between the lower barrier layer 13 and the first upper barrier layer 15-1 having a wider bandgap than the channel layer. Therefore, the channel layer 14 will be a two-dimensional electron gas layer in which carriers are accumulated when carriers are supplied from the carrier supply regions 13a and 15a in the lower barrier layer 13 and the first upper barrier layer 15-1.

Additionally, in the hetero junction between the channel layer 14 and the first upper barrier layer 15-1, a discontinuous quantity ΔEc of the conduction band to be the carrier travel side is sufficiently high (0.31 eV in this case). Moreover, the semiconductor device 1-2 is configured so that the difference between the minimum point of the conduction band energy Ec in the first upper barrier layer 15-1 and the conduction band energy Ec in the channel layer 14 is also sufficiently high (0.20 eV or more in this case). Accordingly, the number of electrons distributed in the first upper barrier layer 15-1 is reduced to be vanishingly small as compared with the number of electrons distributed in the channel layer 14.

<Operation of Semiconductor Device in Second Embodiment>

The semiconductor device 1-2 having the above structure operates in the same manner as the semiconductor device according to the first embodiment.

<Manufacturing Method of Semiconductor Device in Second Embodiment>

Manufacturing of the semiconductor device 1-2 having the above structure differs from the manufacturing procedures of the semiconductor device according to the first embodiment only in a process of forming the first upper barrier layer 15-1 and the second upper barrier layer 15-2 sequentially in this order by epitaxial growth over the channel layer 14. The low-resistance region 15g is formed by diffusing zinc (Zn) as a p-type impurity into the second upper barrier layer 15-2 made of, for example, GaAs mixed crystal.

<Advantages of Semiconductor Device of Second Embodiment>

The semiconductor device 1-2 explained above is provided with the gate electrode 19 above the low-resistance region 15g through the gate insulating layer 18 in the structure in which the p-type low-resistance region 15g is provided in the n-type second upper barrier layer 15-2 not containing an impurity or with a low concentration. Therefore, it is possible to improve the maximum drain current idmax by preventing gate leakage current flowing when forward voltage is applied to the gate electrode 19 as well as to downsize the device and to reduce parasitic capacitance with respect to the device in the same manner as the semiconductor device according to the first embodiment.

Additionally, the semiconductor device 1-2 according to the second embodiment is configured so that the upper barrier layer in which the low-resistance region 15g containing the p-type impurity is formed has a stacked structure of the first upper barrier layer 15-1 and the second upper barrier layer 15-2. Accordingly, it is possible to select a material having great bandgap difference with respect to the channel layer 14 as the first upper barrier layer 15-1 as well as to select a material in which diffusion velocity of the p-type impurity is slow as the second upper barrier layer 15-2 without considering the bandgap. Then, diffusion controllability of the p-type impurity with respect to the second upper barrier layer 15-2 is improved, therefore, the low-resistance region 15g in which a depth profile of the p-type impurity concentration and the diffusion of the p-type impurity in the lateral direction are controlled with high accuracy can be obtained. As a result, the distance between the gate electrode 19 and the channel layer 14 can be reduced with high accuracy and an effect of reducing the on-resistance Ron by the gate voltage can be improved. Also according to the above, it can be expected that the maximum drain current idmax is improved, the device is downsized and the parasitic capacitance with respect to the device is reduced. Furthermore, as the depth of the low-resistance region 15g is controlled with high accuracy, the distance from the low-resistance region 15g and the channel layer 14 can be set with high accuracy, which stabilizes a threshold voltage, the on-resistance Ron and the maximum drain current idmax.

3. Third Embodiment

Example in which Barrier Layers are all Formed as High-Resistance Regions

Figure 9:
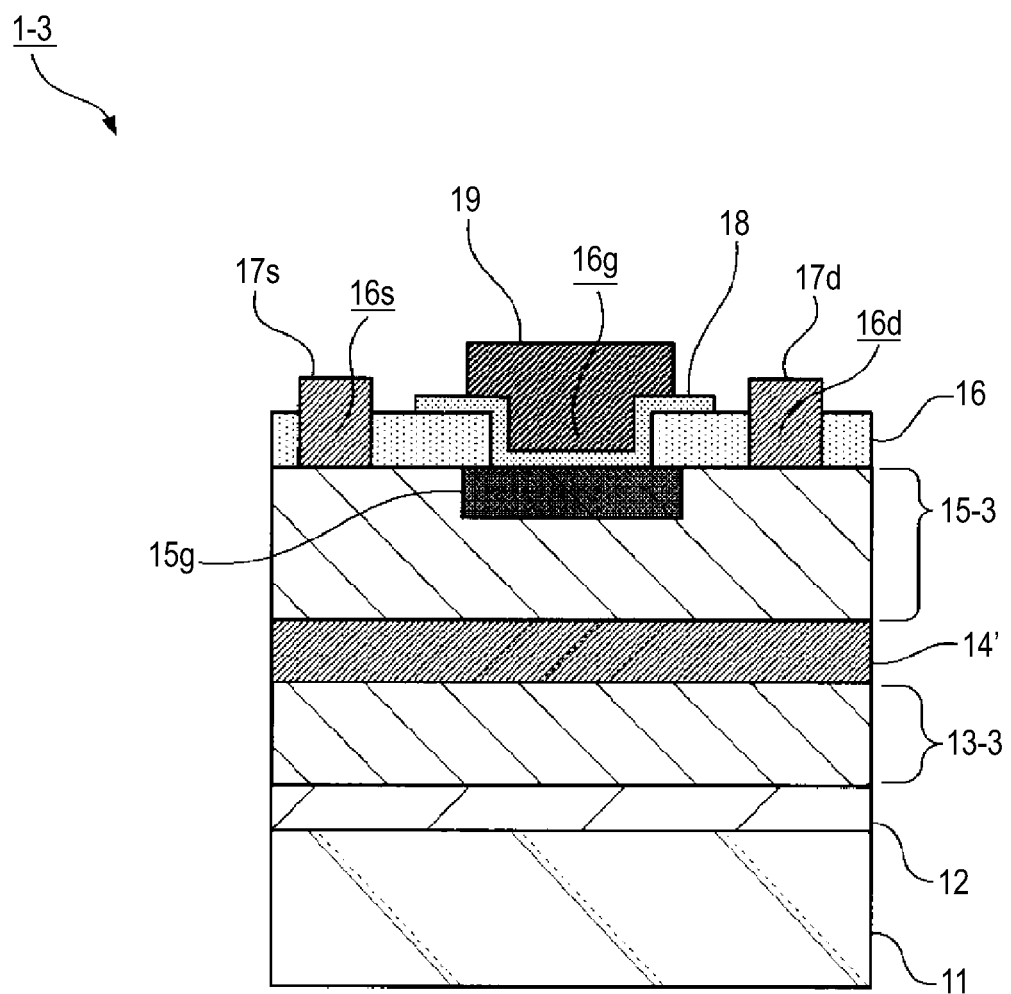
FIG. 9 is a cross-sectional view showing a structure of a relevant part of a semiconductor device according to a third embodiment.

FIG. 9 is a cross-sectional view showing a structure of a relevant part of a semiconductor device according to a third embodiment. Hereinafter, the structure of the semiconductor device according to the third embodiment to which the present disclosure is applied will be explained with reference to the drawing.

<Structure of Semiconductor Device in Third Embodiment>

A semiconductor device 1-3 according to the third embodiment shown in FIG. 9 differs from the semiconductor device of the first embodiment explained with reference to FIG. 1 in points that a lower barrier layer 13-3 and an upper barrier layer 15-3 do not have the carrier supply region and that an n-type impurity is contained in a channel layer 14'. Other components are the same as the first embodiment. Therefore, the same numerals and signs are given to the same components as the first embodiment and the detailed explanation in the present embodiment is omitted.

[Lower Barrier Layer 13-3, Upper Barrier Layer 15-3]

The lower barrier layer 13-3 and the upper barrier layer 15-3 are formed by using respective compound semiconductor materials having good lattice matching with layers touched by these layers. These compound semiconductor materials includes compound semiconductors in which energy bands on the carrier travel side in junctions with respect to the channel layer 14 are farther from the intrinsic Fermi level in the channel layer than in the channel layer 14. The above is the same as other embodiments.

The lower barrier layer 13-3 and the upper barrier layer 15-3 are characterized in that they do not have the carrier supply region including the n-type impurity, and each layer is configured as a single layer structure in which the whole region in the film thickness direction is the high-resistance region. Here, the lower barrier layer 13-3 is formed as an n-type or a p-type high-resistance region. On the other hand, the upper barrier layer 15-3 is formed as an n-type high-resistance region. The lower barrier layer 13-3 and the upper barrier layer 15-3 preferably have an impurity concentration of $1 \times 10^{17}/cm^3$ or less and a resistivity of $1 \times 10^{-2}$ Ωcm or more.

In the above structure, the p-type low-resistance region 15g is provided in a surface layer of the upper barrier layer 15-3 formed as the n-type high-resistance region.

[Channel Layer 14']

The channel layer 14' is made of a compound semiconductor material having good lattice matching with the lower barrier layer 13-3 and the upper barrier layer 15-3. Each compound semiconductor material includes a compound semiconductor in which energy bands on the carrier travel side in hetero junctions with respect to the lower barrier layer 13-3 and the upper barrier layer 15-3 are closer to the intrinsic Fermi level in the channel layer than energy bands on the carrier travel side in respective compound semiconductor materials forming the lower barrier layer 13-3 and the upper barrier layer 15-3. The above is the same as other embodiments.

The channel layer 14' is characterized in that the n-type impurity is contained as an impurity supplying carriers (for example, electrons in this case). The concentration of the n-type impurity contained in the channel layer 14' is appropriately determined according to the maximum drain current Idmax in the semiconductor device 1-3. In this case, assume that, for example, an n-type impurity of approximately $2.0 \times 10^{18}/cm^3$ is added to the channel layer 14'.

<Operation and Manufacturing Method of Semiconductor Device in Third Embodiment>

The semiconductor device 1-3 having the above structure operates in the same manner as the semiconductor device according to the first embodiment. The semiconductor device 1-3 is manufactured by omitting the process of forming the carrier supply region in the manufacturing procedures of the semiconductor device according to the first embodiment.

<Advantages of Semiconductor Device of Third Embodiment>

The semiconductor device 1-3 explained as the above has the structure in which the p-type low-resistance region 15g is provided in the surface layer of the upper barrier layer 15-3 formed as the n-type high-resistance region and the gate electrode 19 is provided above the low-resistance region 15g through the gate insulating layer 18. Therefore, it is possible to improve the maximum drain current idmax by preventing gate leakage current as well as to downsize the device and to reduce parasitic capacitance with respect to the device in the same manner as the semiconductor device according to the first embodiment.

Additionally, the semiconductor device 1-3 according to the third embodiment is configured so that the channel layer 14' contains the n-type impurity, and each of the lower barrier layer 13-3 and the upper barrier region 15-3 has the structure of the single layer of the high-resistance region by omitting the carrier supply region from each layer. Accordingly, the same advantages as the semiconductor device according to the first embodiment can be obtained by the simpler structure.

As the impurity concentration of the lower barrier layer 13-3 and the upper barrier region 15-3 is low even when the concentration of the n-type impurity of the channel layer 14' is increased for increasing the maximum drain current idmax, electrons are not accumulated and do not travel in the lower barrier layer 13-3 and the upper barrier region 15-3. Therefore, it is possible to prevent degradation of mutual conductance Gm due to the above.

4. Fourth Embodiment

Figure 10:
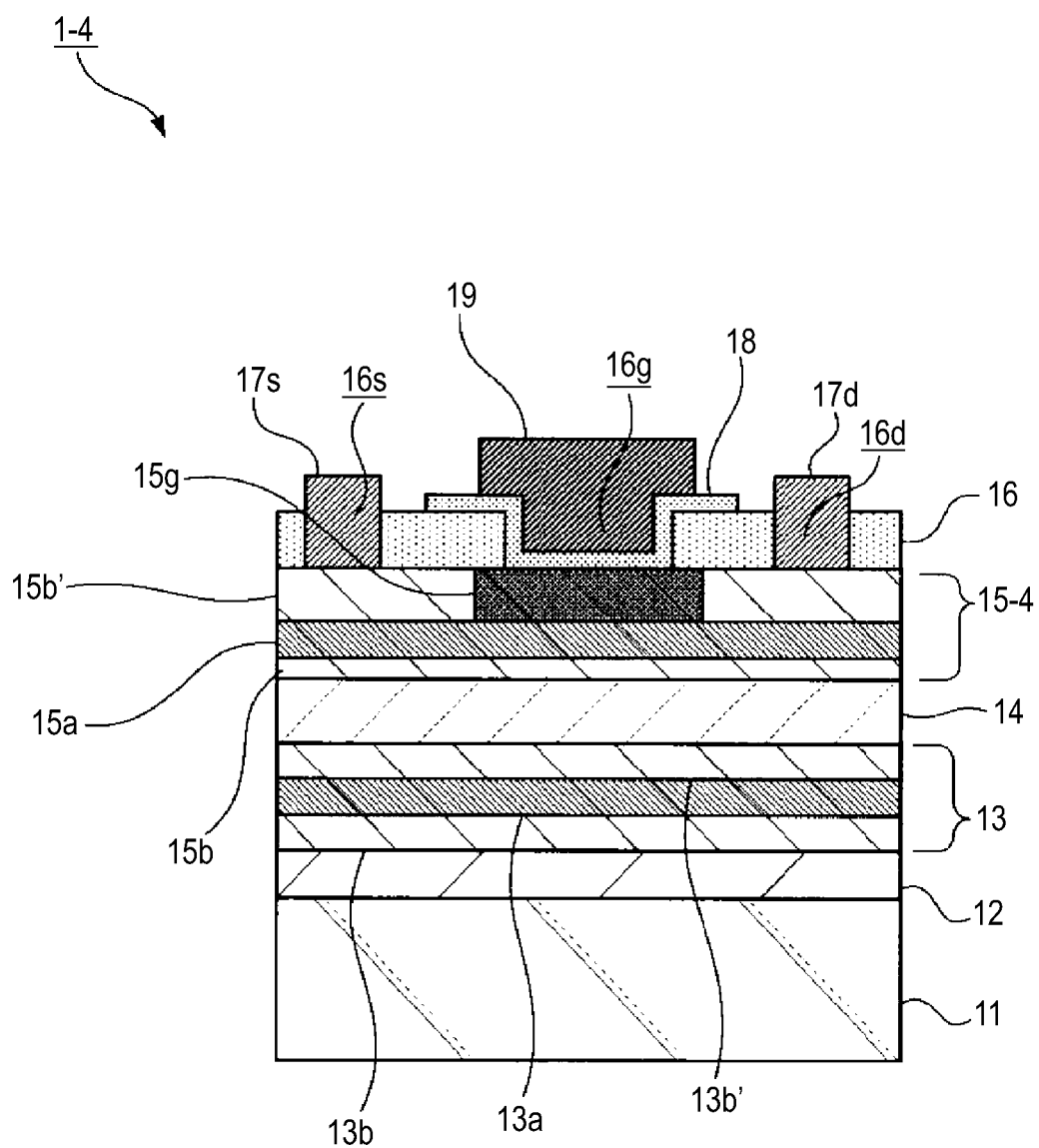
FIG. 10 is a cross-sectional view showing a structure of a relevant part of a semiconductor device according to a fourth embodiment.

Example in which the Carrier Supply Region in the Barrier Layer Touches the Low-Resistance Region FIG. 10 is a cross-sectional view showing a structure of a relevant part of a semiconductor device according to a fourth embodiment. Hereinafter, the structure of the semiconductor device according to the fourth embodiment to which the present disclosure is applied will be explained with reference to the drawing.

<Structure of Semiconductor Device in Fourth Embodiment>

A semiconductor device 1-4 according to the fourth embodiment shown in FIG. 10 differs from the semiconductor device of the first embodiment explained with reference to FIG. 1 in a point that the p-type low-resistance region 15g provided in a surface layer of the upper barrier layer 15-4 is arranged so as to touch the carrier supply region 15a. Other components are the same as the first embodiment. Therefore, the same numerals and signs are given to the same components as the first embodiment and the detailed explanation in the present embodiment is omitted.

That is, the depth of the p-type low-resistance region 15g provided in the surface layer of the upper barrier layer 15-4 corresponds to a film thickness of a high-resistance region 15b' forming the top layer of the upper barrier layer 15-4. The p-type low-resistance region 15g is provided so as to touch the n-type carrier supply region 15a containing the n-type impurity.

<Operation and Manufacturing Method of Semiconductor Device in Fourth Embodiment>

The semiconductor device 1-4 having the above structure operates in the same manner as the semiconductor device according to the first embodiment. The semiconductor device 1-4 is manufactured by forming the high-resistance region 15b' forming the top layer of the upper barrier layer 15-4 to have the film thickness corresponding to the depth of the p-type low-resistance region 15g which is formed later in manufacturing procedures of the semiconductor device according to the first embodiment.

<Advantages of Semiconductor Device of Fourth Embodiment>

The semiconductor device 1-4 explained above has the structure in which the p-type low-resistance region 15g is provided in the n-type high-resistance region 15b' not containing an impurity or with low concentration and the gate electrode 19 is provided above the low-resistance region 15g through the gate insulating layer 18 in the same manner as the first embodiment. Therefore, it is possible to improve the maximum drain current idmax by preventing gate leakage current as well as to downsize the device and to reduce parasitic capacitance with respect to the device in the same manner as the semiconductor device according to the first embodiment.

Additionally, as the semiconductor device 1-4 according to the fourth embodiment particularly has the structure in which the p-type low-resistance region 15g is provided so as to touch the carrier supply region 15a, the distance between the p-type low-resistance region 15g and the channel layer 14 can be shortened. Accordingly, it is possible to increase controllability of potential in the channel layer 14 due to the gate voltage, which can also realize improvement of the maximum drain current idmax, downsizing of the device and reduction of parasitic capacitance with respect to the device. Furthermore, it is possible to narrow the distance from the low-resistance region 15g to the channel layer 14, therefore, the threshold voltage can be set to a relatively high value.

Additionally, in the condition in which the impurity concentration of the carrier supply region 15a is relatively high with respect to the p-type low-resistance region 15g, zinc (p-type impurity) diffused into the carrier supply region 15a is cancelled out by the impurity in the carrier supply region 15a. Therefore, the depth of the p-type low-resistance region 15g formed by diffusing the p-type impurity such as zinc (Zn) can be equalized with the film thickness of the n-type high-resistance region 15b' of the top layer. Accordingly, the depth of the p-type low-resistance region 15g is controlled with high accuracy by the film thickness of the high-resistance region 15b' on the carrier supply region 15a, which can accurately form the thin low-resistance region 15g. Also according to this, it is possible to shorten the distance between the p-type low-resistance region 15g and the channel layer 14 and to increase controllability of potential in the channel layer 14 by the gate voltage.

In the fourth embodiment, the structure in which the p-type low-resistance region 15g is arranged so as to touch the carrier supply region 15a in the structure explained with reference to FIG. 1 in the first embodiment has been explained. However, the fourth embodiment is not limited to the application to the first embodiment and can be combined with the second embodiment. In this case, the p-type low-resistance region 15g provided in the surface layer of the second upper barrier layer 15-2 is provided so as to touch the carrier supply region 15a in the first upper barrier layer 15-1 in the structure of the second embodiment with reference to FIG. 7. Also according to the structure, it is possible to control the spread of the p-type low-resistance region 15g in the transverse direction in the second upper barrier layer 15-2 with high accuracy.

5. Fifth Embodiment

Figure 11:
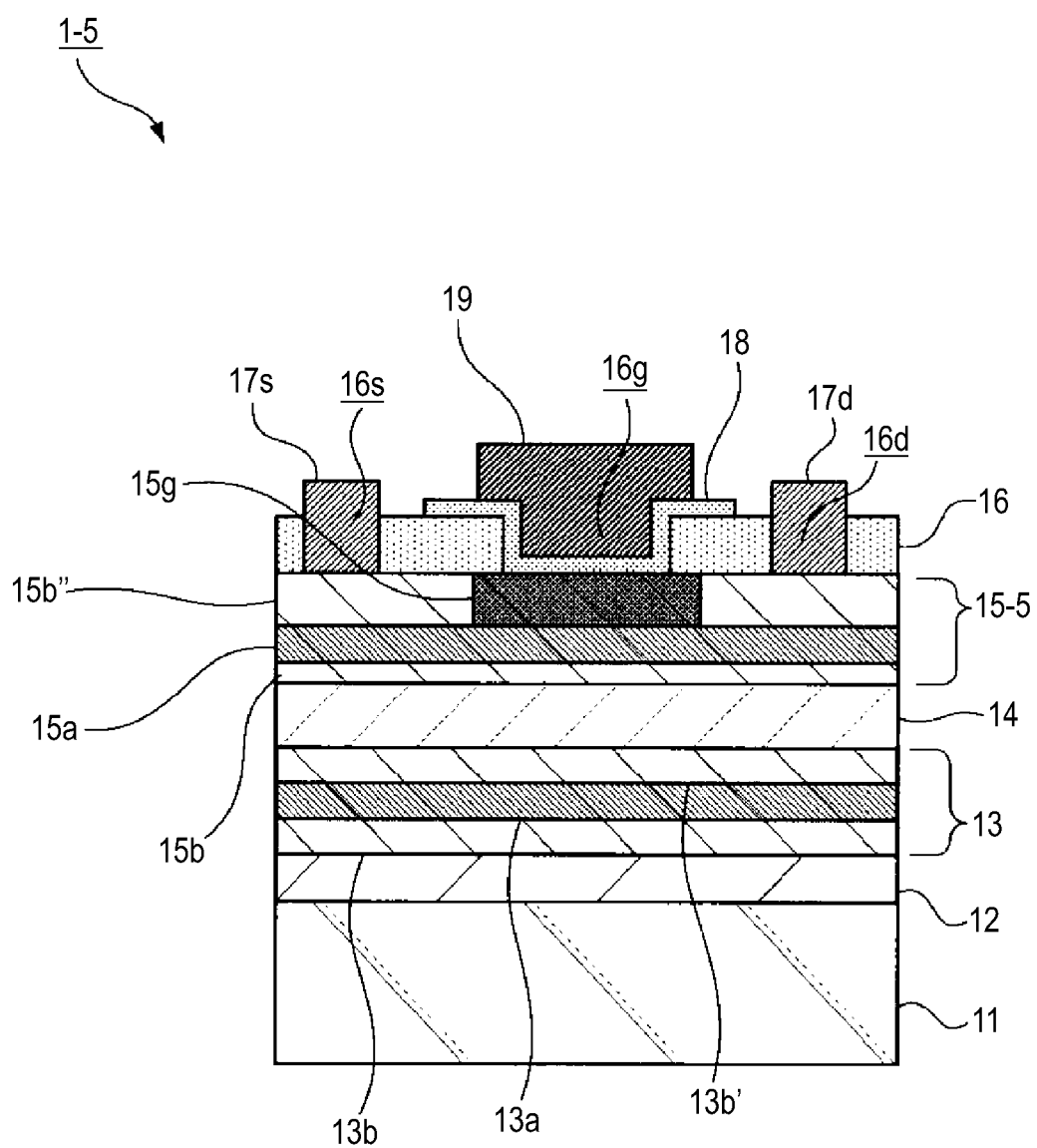
FIG. 11 is a cross-sectional view showing a structure of a relevant part of a semiconductor device according to a fifth embodiment.

Example in which a Region Between the Carrier Supply Region and the Low-Resistance Region in the Barrier Layer is Formed as a Low-Resistance Region FIG. 11 is a cross-sectional view showing a structure of a relevant part of a semiconductor device according to a fifth embodiment. Hereinafter, the structure of the semiconductor device according to the fifth embodiment to which the present disclosure is applied will be explained with reference to the drawing.
<Structure of Semiconductor Device in Fifth Embodiment>

A semiconductor device 1-5 according to the fifth embodiment shown in FIG. 11 differs from the semiconductor device of the first embodiment explained with reference to FIG. 1 in a point that the top layer of an upper barrier layer 15-5 is formed as a low-resistance region 15b'' instead of the high-resistance region. Other components are the same as the first embodiment. Therefore, the same numerals and signs are given to the same components as the first embodiment and the detailed explanation in the present embodiment is omitted.

That is, the low-resistance region 15b'' provided in a surface layer of the upper barrier layer 15-5 is formed to be low resistance containing an n-type impurity, and the p-type low-resistance region 15g is provided in the surface layer.
<Operation and Manufacturing Method of Semiconductor Device in Fifth Embodiment>

The semiconductor device 1-5 having the above structure operates in the same manner as the semiconductor device according to the first embodiment. The semiconductor device 1-5 is manufactured by forming the low-resistance region 15b'' containing the n-type impurity by epitaxial growth as the top layer of the upper barrier layer 15-5 in manufacturing procedures of the semiconductor device according to the first embodiment.
<Advantages of Semiconductor Device of Fifth Embodiment>

The semiconductor device 1-5 explained above has the structure in which the p-type low-resistance region 15g is provided in the n-type the low-resistance region 15b'' forming the top layer of the upper barrier layer 15-5, and the gate electrode 19 is provided above the low-resistance region 15g through the insulating layer 18. Therefore, it is possible to improve the maximum drain current idmax by preventing gate leakage current as well as to downsize the device and to reduce parasitic capacitance with respect to the device in the same manner as the semiconductor device according to the first embodiment.

Additionally, as the semiconductor device 1-5 according to the fifth embodiment particularly has the structure in which the p-type low-resistance region 15g is provided in the n-type low-resistance region 15b'', the sheet carrier density in the channel layer 14 can be increased as well as channel resistance and access resistance can be reduced. As a result, it can be expected that the on-resistance Ron is reduced and the maximum drain current Idmax is increased.

In the fifth embodiment, the structure in which the high-resistance region surrounding the p-type low-resistance region 15g is changed to the n-type low-resistance region 15b'' in the structure explained with reference to FIG. 1 in the first embodiment has been explained. However, the fifth embodiment is not limited to the application to the first embodiment and can be combined with the second to fourth embodiments. In this case, the region surrounding the p-type low-resistance region 15g is formed as the low-resistance region of the reverse-conductive type (n-type) in the second to fourth embodiments. Accordingly, the same advantages as the fifth embodiment can be obtained together with the advantages of the second to fourth embodiments.

6. Sixth Embodiment

Figure 12:
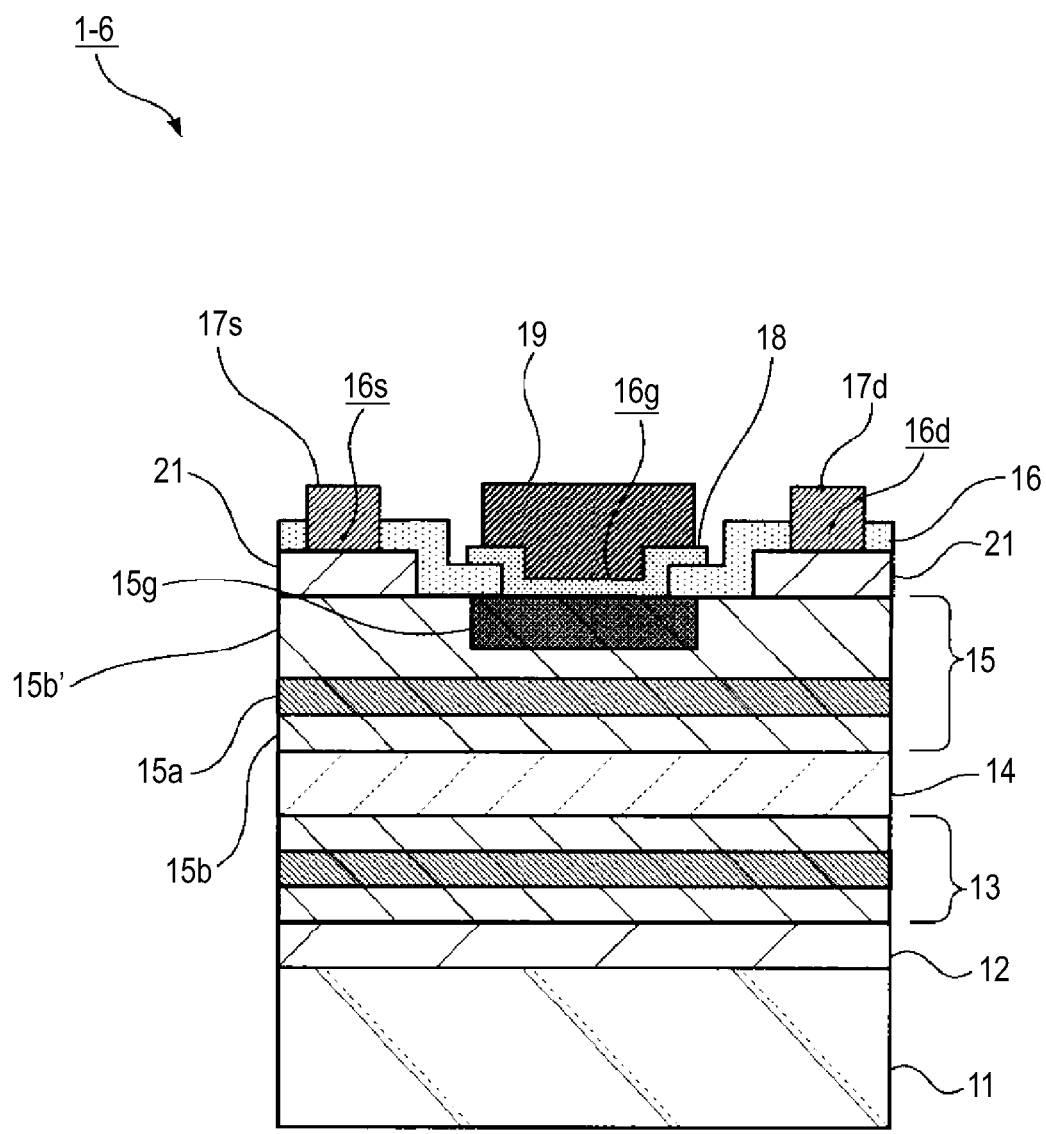
FIG. 12 is a cross-sectional view showing a structure of a relevant part of a semiconductor device according to a sixth embodiment.

Example in which a Cap Layer is Provided Between the Barrier Layer and the Source Electrode/Drain Electrode FIG. 12 is a cross-sectional view showing a structure of a relevant part of a semiconductor device according to a sixth embodiment. Hereinafter, the structure of the semiconductor device according to the sixth embodiment to which the present disclosure is applied will be explained with reference to the drawing.
<Structure of Semiconductor Device in Sixth Embodiment>

A semiconductor device 1-6 according to the sixth embodiment shown in FIG. 12 differs from the semiconductor device of the first embodiment explained with reference to FIG. 1 in a point that a cap layer 21 is provided between the upper barrier layer 15 and the source electrode 17s/drain electrode 17d. The cap layer 21 is provided as a layer containing an impurity of a conductive type reverse to the low-resistance region 15g. Other components are the same as the first embodiment. Therefore, the same numerals and signs are given to the same components as the first embodiment and the detailed explanation in the present embodiment is omitted.

The cap layer 21 is provided between the upper barrier layer 15 and the source electrode 17s/drain electrode 17d as the layer containing an impurity (n-type impurity in this case) of a conductive type reverse to the low-resistance region 15g. The cap layer 21 may be formed by using a compound semiconductor material having lattice matching with the upper barrier layer 15 and it is not necessary that a bandgap of the material corresponds to the bandgap of the upper barrier layer 15. As a barrier of potential is generated at a junction when these bandgaps are extremely different to each other, there is the danger that resistance in the ohmic junction increases. Therefore, the bandgap of the cap layer 21 is allowed to correspond to the bandgap of the upper barrier layer 15 as the base layer in a range not affecting characteristics of the semiconductor device 1-6. When the upper barrier layer 15 is made of AlGaAs mixed crystal, the above cap layer 21 is made of, for example, GaAs containing an n-type impurity.
<Operation and Manufacturing Method of Semiconductor Device in Sixth Embodiment>

The semiconductor device 1-6 having the above structure operates in the same manner as the semiconductor device according to the first embodiment. The semiconductor device 1-6 is manufactured by forming the n-type GaAs layer to be the cap layer 21 by epitaxial growth subsequent to the deposition of the upper barrier layer 15 in manufacturing procedures of the semiconductor device according to the first embodiment. Next, a deactivated region which has become high resistance by ion implantation of boron is formed as an element isolation region, after that, the n-type GaAs layer is pattern-etched to form the cap layer 21, then, the insulating layer 16 is deposited and subsequent processes are performed.

<Advantages of Semiconductor Device of Sixth Embodiment>

The semiconductor device 1-6 explained above has the structure in which the p-type low-resistance region 15g is provided in the n-type high-resistance region 15b' not containing an impurity or with low concentration and the gate electrode 19 is provided above low-resistance region 15g through the gate insulating layer 18 in the same manner as the semiconductor device according to the first embodiment. Therefore, it is possible to improve the maximum drain current Idmax by preventing gate leakage current as well as to downsize the device and to reduce parasitic capacitance with respect to the device in the same manner as the semiconductor device according to the first embodiment.

Additionally, the semiconductor device 1-6 according to the sixth embodiment particularly has the structure in which the cap layer 21 made of the compound semiconductor is provided between the upper barrier layer 15 and the source electrode 17s/drain electrode 17d. Accordingly, the sheet carrier density in the channel layer 14 just below the cap layer 21 can be increased as well as channel resistance and access resistance can be reduced. As a result, it can be expected that the on-resistance Ron is reduced and the maximum drain current Idmax is increased.

In the sixth embodiment, the structure in which the cap layer 21 is provided between the upper barrier layer 15 and the source electrode 17s/drain electrode 17d as the layer containing the impurity of the conductive type reverse to the low-resistance region 15g in the structure explained with reference to FIG. 1 in the first embodiment has been explained. However, the sixth embodiment is not limited to the application to the first embodiment and can be combined with the second to fifth embodiments. In this case, the cap layer 21 is provided between the upper barrier layer (or the second upper barrier layer) in the second to fifth embodiments and the source electrode 17s/drain electrode 17d as the layer containing the n-type impurity as the conductive type reverse to the p-type low-resistance region 15g. Accordingly, the same advantages as the sixth embodiment can be obtained together with the advantages of the second to fifth embodiments.

7. Seventh Embodiment

Figure 13:
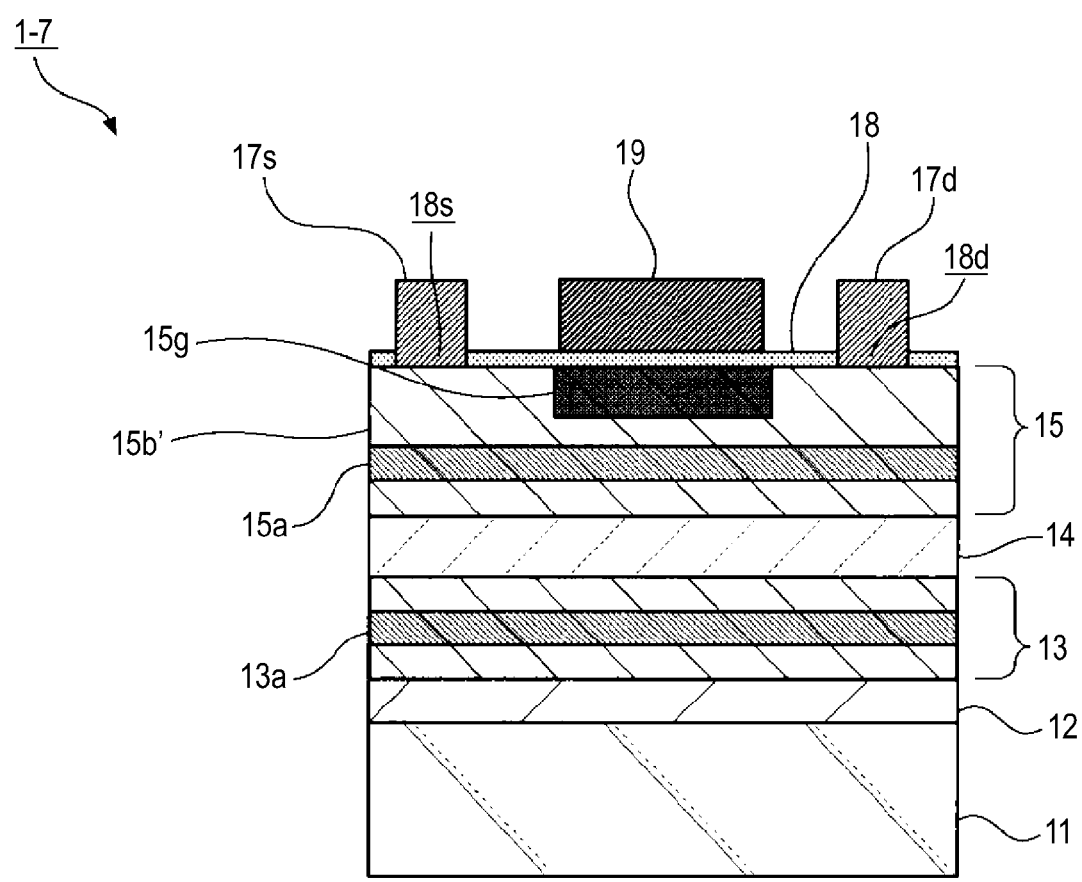
FIG. 13 is a cross-sectional view showing a structure of a relevant part of a semiconductor device according to a seventh embodiment.

Example in which the Whole Surface of the Barrier Layer is Covered with the Gate Insulating Layer FIG. 13 is a cross-sectional view showing a structure of a relevant part of a semiconductor device according to a seventh embodiment. Hereinafter, the structure of the semiconductor device according to the seventh embodiment to which the present disclosure is applied will be explained with reference to the drawing.

<Structure of Semiconductor Device in Seventh Embodiment>

A semiconductor device 1-7 according to the seventh embodiment shown in FIG. 13 differs from the semiconductor device of the first embodiment explained with reference to FIG. 1 in a point that the whole surface of the upper barrier layer 15 is covered with the gate insulating layer 18 and the insulating layer 16 below the gate insulating layer 18 is removed. Other components are the same as the first embodiment. Therefore, the same numerals and signs are given to the same components as the first embodiment and the detailed explanation in the present embodiment is omitted.

That is, the whole surface of the upper barrier layer 15 is covered with the gate insulating layer 18. In the gate insulating layer 18, source opening 18s/drain opening 18d reaching the high-resistance regions 15b' of the upper barrier layer 15 are provided at positions sandwiching the low-resistance region 15g provided in the upper barrier layer 15 and at positions not overlapping the low-resistance region 15g. The source electrode 17s and the drain electrode 17d connected to the high-resistance region 15b' through the source opening 18s/drain opening 18d are provided above the upper barrier layer 15.

<Operation of Semiconductor Device in Seventh Embodiment>

The semiconductor device 1-7 having the above structure operates in the same manner as the semiconductor device according to the first embodiment.

<Manufacturing Method of Semiconductor Device in Seventh Embodiment>

Next, an example of a manufacturing method of the semiconductor device 1-7 having the above structure will be explained with reference to cross-sectional process views of FIGS. 14A, 14B, FIGS. 15A and 15B.

[FIG. 14A]

Figure 14A:
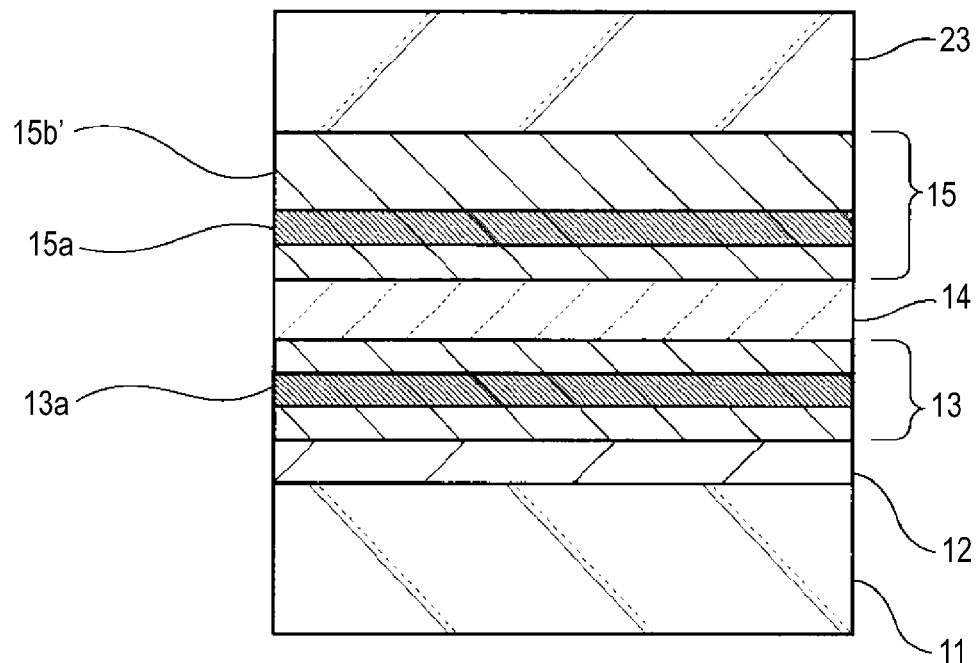
FIGS. 14A and 14B are cross-sectional process views (No. 1) showing manufacturing procedures of the semiconductor device according to the seventh embodiment.

First, as shown in FIG. 14A, the buffer layer 12, the lower barrier layer 13, the channel layer 14 and the upper barrier layer 15 are formed in this order on the substrate 11 by epitaxial growth, then, an element isolation region not shown here is formed in the same procedures as the procedures explained with reference to FIG. 5A in the first embodiment.

After that, a cap layer 23 made of GaAs is formed by epitaxial growth on the high-resistance region 15b' as the top layer of the upper barrier layer 15.

[FIG. 14B]

Figure 14B:
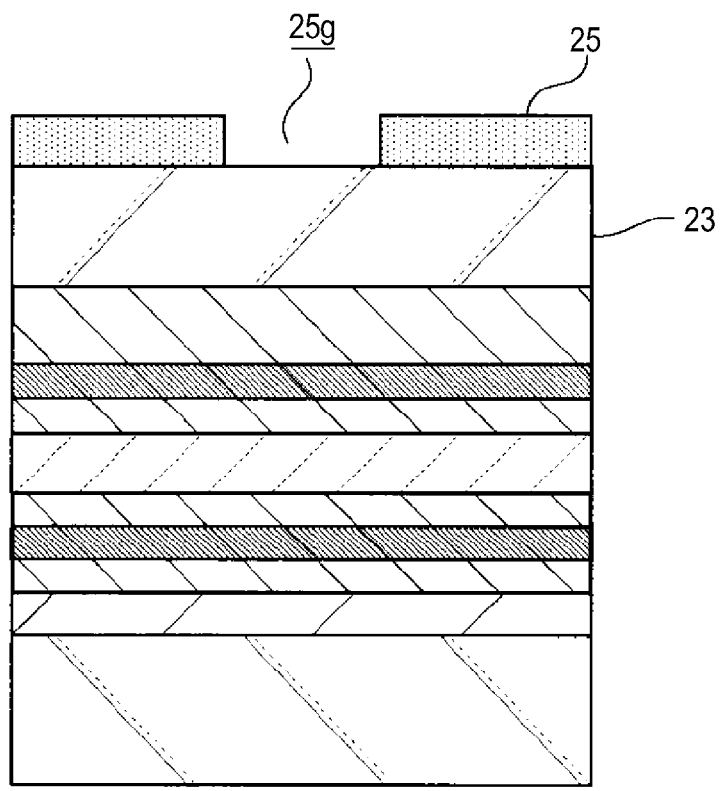

Subsequently, as shown in FIG. 14B, an insulating layer 25 is formed over the cap layer 23 and the insulating layer 25 is pattern-etched to thereby form a gate opening 25g exposing a surface of the cap layer 23 in the insulating layer 25.

[FIG. 15A]

Figure 15A:
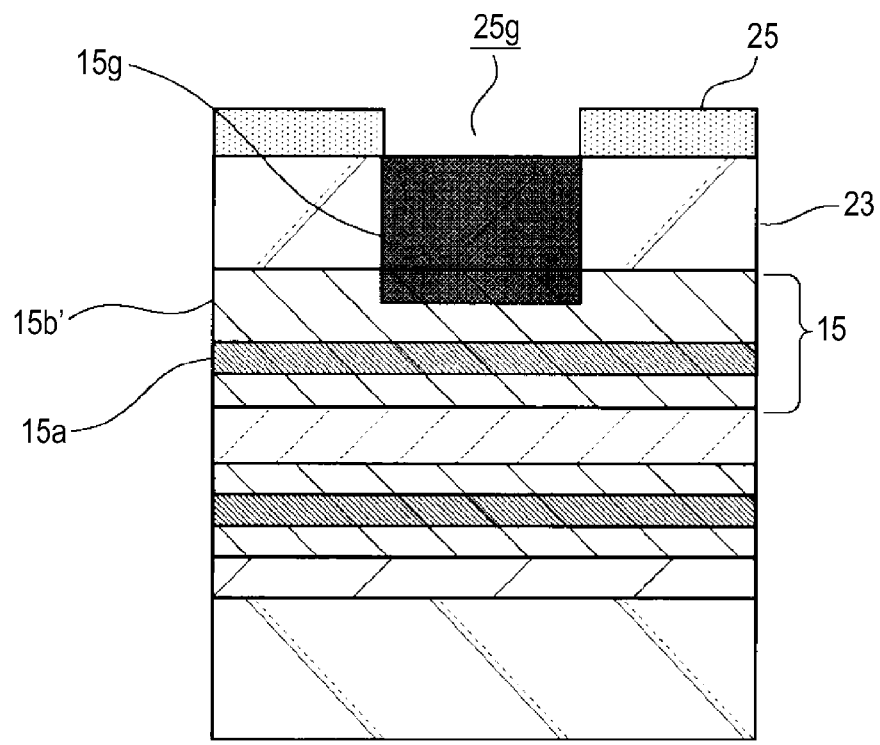
FIGS. 15A and 15B are cross-sectional process views (No. 2) showing manufacturing procedures of the semiconductor device according to the seventh embodiment.

Next, as shown in FIG. 15A, the low-resistance region 15g is formed in a portion from the cap layer 23 to the surface layer of the high-resistance region 15b' of the upper barrier layer 15 by implantation of a p-type impurity from the surface layer of the cap layer 23 exposing at the bottom of the gate opening 25g. In this case, the low-resistance region 15g is formed by diffusing zinc (An) as a p-type impurity only at a position not reaching the carrier supply region 15a, that is, only the surface layer in the high-resistance region 15b'. The diffusion of zinc (Zn) is performed, for example, by vapor phase diffusion using the zinc compound gas at a temperature of approximately 600 degrees.

[FIG. 15B]

Figure 15B:
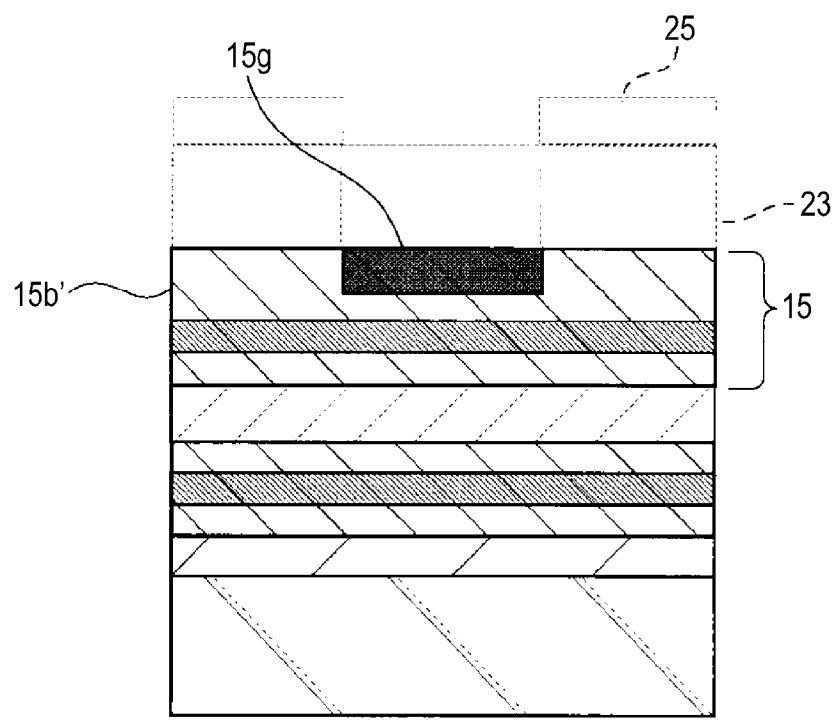

After that, as shown in FIG. 15B, the insulating layer 25 and the cap layer 23 are removed by etching to leave the high-resistance region 15b' forming the top layer of the upper barrier layer 15 and the low-resistance region 15g to which the p-type impurity is implanted on the surface layer.

After the above process, the gate insulating layer 18 is deposited over the upper barrier layer 15 in which the low-resistance region 15g is formed as shown in FIG. 13. Next, the source opening 18s and the drain opening 18d are formed at positions sandwiching the low-resistance region 15g in the gate insulating layer 18, and the source electrode 17s/drain electrode 17d connected to the high-resistance region 15b' through the source opening 18s/drain opening 18d are formed. Then, the gate electrode 19 is formed on the gate insulating layer 18 at a position overlapping above the low-resistance region 15g to complete the semiconductor device 1-7.

<Advantages of Semiconductor Device of Seventh Embodiment>

The semiconductor device 1-7 explained above has the structure in which the p-type low-resistance region 15g is provided in the n-type high-resistance region 15b' not containing an impurity or with low concentration and the gate electrode 19 is provided above the low-resistance region 15g through the gate insulating layer 18 in the same manner as the semiconductor device according to the first embodiment. Therefore, it is possible to improve the maximum drain current Idmax by preventing gate leakage current as well as to downsize the device and to reduce parasitic capacitance with respect to the device in the same manner as the semiconductor device according to the first embodiment.

Particularly in the manufacturing method of the seventh embodiment, when the low-resistance region 15g is formed in the upper barrier layer 15, zinc (Zn) which is the p-type impurity is diffused into the high-resistance region 15b' in the upper barrier layer 15 through the cap layer 23 as explained with reference to FIG. 15A. Accordingly, the depth of diffusion of the p-type impurity in the high-resistance region 15b' can be small, therefore, it is possible to easily form the low-resistance region 15g formed by diffusing the p-type impurity into the high-resistance region 15b' to be shallow. That is, it was difficult to form an impurity region of 50 nm or less in the method of forming the low-resistance region 15g in which direct diffusion is performed to the high-resistance region 15b not through the cap layer 23, however, the low-resistance region 15g with an extremely shallow depth can be formed by using the above method.

In the seventh embodiment, the structure in which the whole surface of the upper barrier layer 15 is covered with the gate insulating layer 18 and the insulating layer 16 below the gate insulating layer 18 is removed in the structure explained in the first embodiment has been explained. However, the seventh embodiment can apply a structure in which the whole surface of the upper barrier layer 15 is covered with the gate insulating layer 18 and the insulating layer 16 below the gate insulating layer 18 is removed in the structures explained in the second to sixth embodiments. Additionally, the manufacturing method explained in the seventh embodiment can be also applied to manufacture of a semiconductor device having the structure in which the insulating layer 16 is provided in addition to the gate insulating layer 18. In this case, after the low-resistance region 15g is formed and the cap layer 23 is removed as explained with reference to FIG. 15A, the insulting film 16 is formed as explained with reference to FIG. 5B, then, the gate insulating layer 18 is formed, thereby obtaining the same advantages.

In the method explained in the seventh embodiment, the insulating layer 25 and the cap layer 23 are removed after the low-resistance region 15g is formed as explained in FIG. 15B. However, the insulating layer 25 and the cap layer 23 are allowed to remain as they are and the gate insulating layer 18 is formed thereon, thereby obtaining the semiconductor device 1-6 of the sixth embodiment explained with reference to FIG. 12 and obtaining the same advantages.

8. Eighth Embodiment

Figure 16:
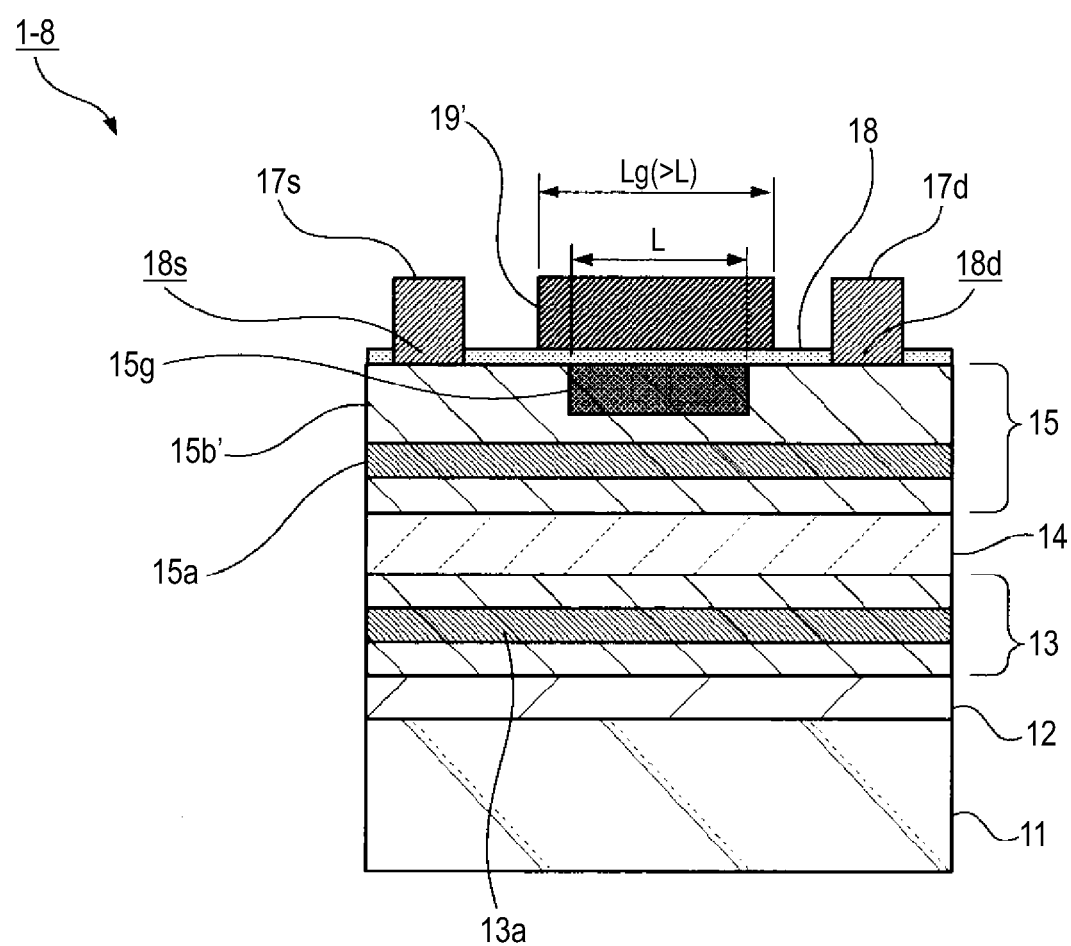
FIG. 16 is a cross-sectional view showing a structure of a relevant part of a semiconductor device according to an eighth embodiment.

Example in which the Low-Resistance Region is Covered with the Gate Electrode FIG. 16 is a cross-sectional view showing a structure of a relevant part of a semiconductor device according to an eighth embodiment. Hereinafter, the structure of the semiconductor device according to the eighth embodiment to which the present disclosure is applied will be explained with reference to the drawing.

<Structure of Semiconductor Device in Eighth Embodiment>

A semiconductor device 1-8 according to the eighth embodiment shown in FIG. 16 differs from the semiconductor device of the first embodiment explained with reference to FIG. 1 in a point that the whole surface of the upper barrier layer 15 is covered with the gate insulating layer 18 and the insulating layer 16 below the gate insulating layer 18 is removed as well as in a gate length Lg of a gate electrode 19'. Other components are the same as the first embodiment. Therefore, the same numerals and signs are given to the same components as the first embodiment and the detailed explanation in the present embodiment is omitted.

The surface of the upper barrier layer 15 is covered with the gate insulating layer 18. In the gate insulating layer 18, the source opening 18s/drain opening 18d reaching the high-resistance regions 15b' of the upper barrier layer 15 are provided at positions sandwiching the low-resistance region 15g provided in the upper barrier layer 15 and at positions not overlapping the low-resistance region 15g. The source electrode 17s and the drain electrode 17d connected to the high-resistance region 15b' through the source opening 18s/drain opening 18d are provided above the upper barrier layer 15. The structure is the same as the seventh embodiment which has been explained with reference to FIG. 13.

The gate electrode 19' is characterized by including a shape in which an upper portion of the low-resistance region 15g is completely covered. In the gate electrode 19', a length in the direction between the source electrode 17s and the drain electrode 17d, namely, the gate length Lg is set to be longer than a length L of the low-resistance 15g. Here, the gate length Lg of the gate electrode 19' is particularly a length of a portion arranged above the upper barrier layer 15 only through the gate insulating layer 18, which is an effective gate length.

<Operation of Semiconductor Device in Eighth Embodiment>

The semiconductor device 1-8 having the above structure operates in the same manner as the semiconductor device according to the first embodiment.

<Manufacturing Method of Semiconductor Device in Eighth Embodiment>

Next, a manufacturing method of the semiconductor device 1-8 having the above structure is the same as the procedures explained in the seventh embodiment with reference to the cross-sectional process views of FIGS. 14A, 14B, FIGS. 15A and 15B, which differs from the procedures only in the shape of the gate electrode 19' (gate length Lg).

<Advantages of Semiconductor Device of Eighth Embodiment>

The semiconductor device 1-8 explained above has the structure in which the p-type low-resistance region 15g is provided in the n-type high-resistance region 15b' not containing an impurity or with low concentration and the gate electrode 19' is provided above the low-resistance region 15g through the gate insulating layer 18 in the same manner as the semiconductor device according to the first embodiment. Therefore, it is possible to improve the maximum drain current Idmax by preventing gate leakage current as well as to downsize the device and to reduce parasitic capacitance with respect to the device in the same manner as the semiconductor device according to the first embodiment.

Additionally, the semiconductor device 1-8 according to the eighth embodiment particularly includes the shape in which the gate electrode 19' completely covers the upper portion of the low-resistance region 15g. Accordingly, when the gate voltage (positive voltage) is applied to the gate electrode 19', complete depletion of the p-type low-resistance region 15g can be easily realized. That is, it is possible to prevent generation of the carrier depletion region at the end of the gate in the channel layer 14 and to suppress the increase of parasitic capacitance at the time of on-operation. As a result, it can be expected that the on-resistance Ron is reduced and the maximum drain current Idmax is increased.

The structure of the semiconductor device according to the eighth embodiment can be combined with the semiconductor device in which the insulating layer 16 is provided in addition to the gate insulating layer 18 as explained in the first to the fifth embodiments. As a manufacturing method in this case, the insulating layer 16 is formed in the same manner as explained with reference to FIG. 5B after forming the low-resistance region 15g and removing the cap layer 23, then, the gate opening 16g is formed to have an opening length exceeding the length L of the low-resistance region 15g when forming the gate opening 16g in the insulating layer 16. After that, the gate insulating layer 18 is formed and the source electrode 17s/drain electrode 17d and the gate electrode 19' are formed.

9. Ninth Embodiment

Example in which the Low-Resistance Region is Stacked on the Barrier Layer

Figure 17:
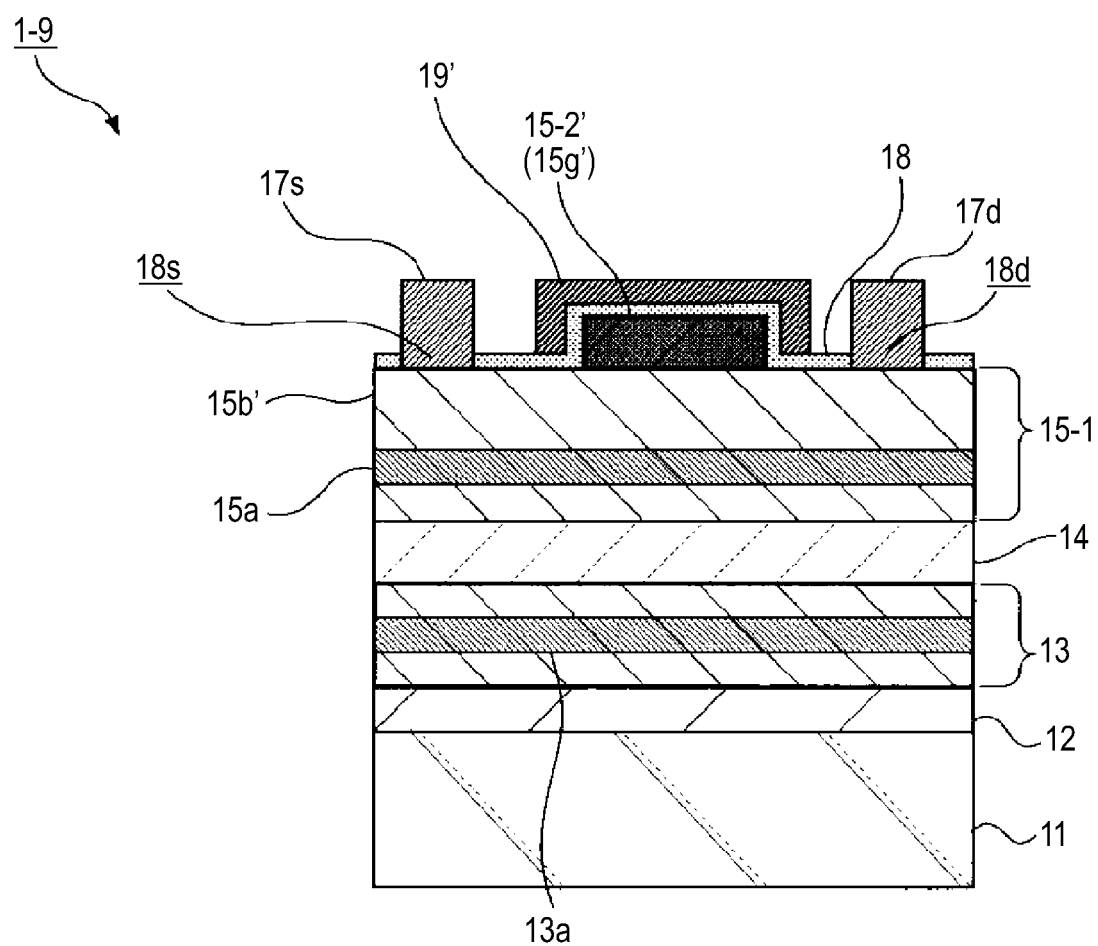
FIG. 17 is a cross-sectional view showing a structure of a relevant part of a semiconductor device according to a ninth embodiment.

FIG. 17 is a cross-sectional view showing a structure of a relevant part of a semiconductor device according to a ninth embodiment. Hereinafter, the structure of the semiconductor device according to the ninth embodiment to which the present disclosure is applied will be explained with reference to the drawing.

<Structure of Semiconductor Device in Ninth Embodiment>

A semiconductor device 1-9 according to the ninth embodiment shown in FIG. 17 differs from the semiconductor device of the first embodiment explained with reference to FIG. 1 in a point that the upper barrier layer has a stacked structure of the first barrier layer 15-1 and a second upper layer 15-2'. The semiconductor device 1-9 also differs in a point that the whole surface of the upper barrier layer of the stacked structure is covered with the gate insulating layer 18 and the insulating layer 16 below the gate insulating layer 18 is removed. Other components are the same as the first embodiment. Therefore, the same numerals and signs are given to the same components as the first embodiment and the detailed explanation in the present embodiment is omitted.

The first upper barrier layer 15-1 is the layer provided so as to touch the channel layer 14, which is configured in the same manner as the upper barrier layer 15 of the first embodiment. However, the first upper barrier layer 15-1 differs from the upper barrier layer of the first embodiment in points that the whole region of the first upper barrier layer 15-1 can be formed as the carrier supply region 15a and that the low-resistance region is not provided.

Particularly, the second upper barrier layer 15-2' is a layer formed by patterning above the channel layer 14 through the first barrier layer 15-1, forming the upper barrier layer together with the first upper barrier layer 15-1. The whole region of the second upper barrier layer 15-2' is formed as a low-resistance region 15g' containing a p-type impurity.

The above second upper barrier layer 15-2' is formed by using a compound semiconductor material having lattice matching with the first upper barrier layer 15-1, and it is not necessary that a bandgap of the material corresponds to the bandgap of the first upper barrier layer 15-1.

The above second upper barrier layer 15-2' is made of, for example, AlGaAs mixed crystal in the same manner as the first upper barrier layer 15-1, containing at least one kind of beryllium (Be), carbon (C), magnesium (Mg) and zinc (Zn) as the p-type impurity.

The whole surface on the second upper barrier layer 15-2' and the first upper barrier layer 15-1 is covered with the gate insulating layer 18. The source opening 18s/drain opening 18d reaching the first upper barrier layer 15-1 are provided at positions sandwiching the second upper barrier layer 15-2' forming the low-resistance region. The source electrode 17s and the drain electrode 17d connected to the high-resistance region 15b' of the first upper barrier layer 15-1 through the source opening 18s/drain opening 18d are provided above the first upper barrier layer 15-1.

The gate electrode 19' is formed to be larger than the length of the second upper barrier layer 15-2' as the low-resistance region (15g') in a state of covering an upper portion and side faces of the second upper barrier layer 15-2' through the gate insulating layer 18. The gate electrode 19' can be provided so as to be stacked only on the upper portion of the second upper barrier layer 15-2' as the low-resistance region 15g'.

<Operation of Semiconductor Device in Ninth Embodiment>

The semiconductor device 1-9 having the above structure operates in the same manner as the semiconductor device according to the first embodiment.

<Manufacturing Method of Semiconductor Device in Ninth Embodiment>

Next, an example in which a manufacturing method of the semiconductor device 1-9 having the above structure will be explained based on cross-sectional process views of FIGS. 18A and 18B.

[FIG. 18A]

Figure 18A:
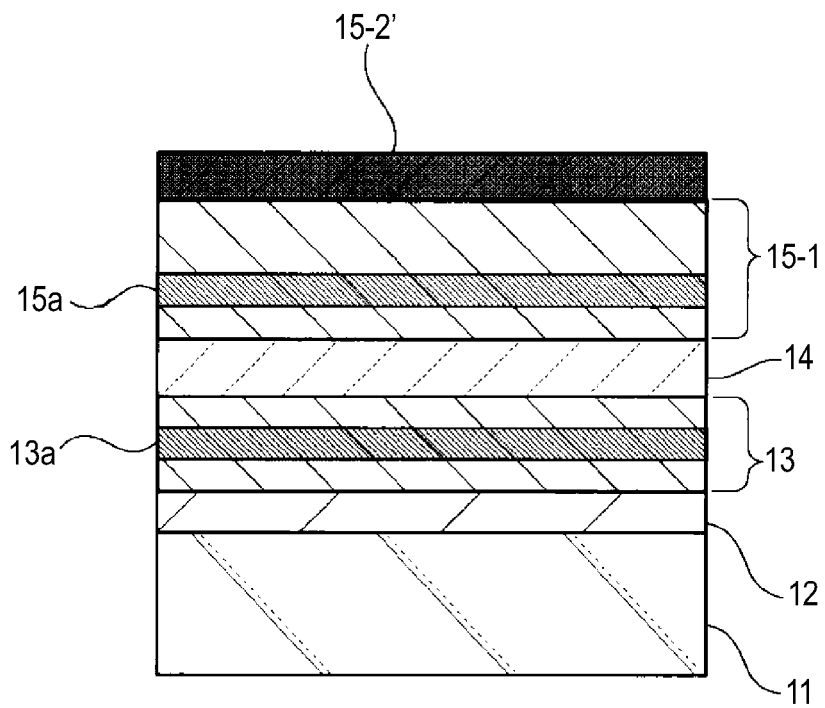
FIGS. 18A and 18B are cross-sectional process views showing manufacturing procedures of the semiconductor device according to the ninth embodiment.

First, as shown in FIG. 18A, the buffer layer 12, the lower barrier layer 13, the channel layer 14 and the first upper barrier layer 15-1 are formed in this order on the substrate 11 by epitaxial growth. The processes so far are performed in the same procedures as explained in the first embodiment with reference to FIG. 5A. Subsequently, for example, the AlGaAs ($Al_{0.2}Ga_{0.8}As$ mixed crystal) layer to which at least one kind of beryllium (Be), carbon (C), magnesium (Mg) and zinc (Zn) is added as the p-type impurity is grown by the epitaxial technology to thereby form the second upper barrier layer 15-2' over the first upper barrier layer 15-1. Next, a deactivated region which has become high resistance by ion implantation such as boron is formed to be the element isolation region not shown here.

[FIG. 18B]

Figure 18B:
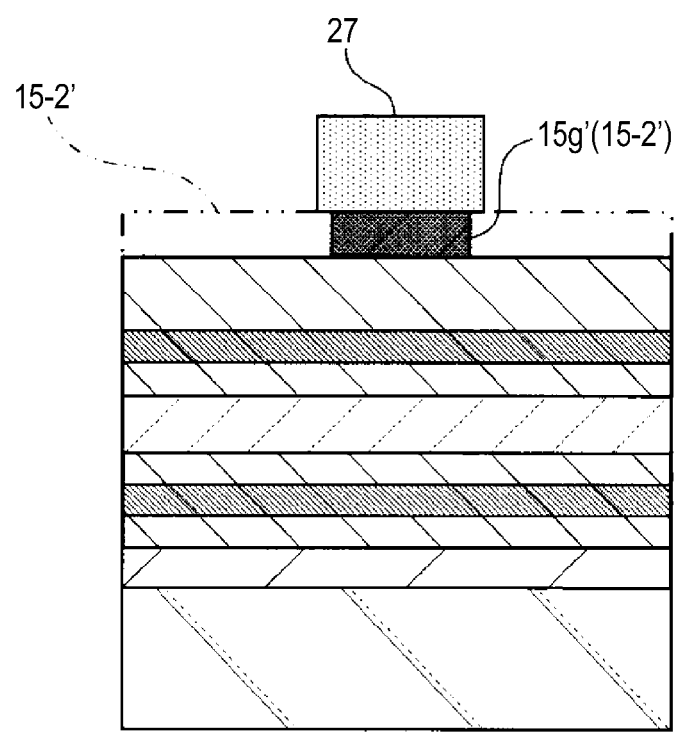

Next, as shown FIG. 18B, a resist pattern 27 is formed by applying a lithography method on a predetermined region to be the p-type low-resistance region on the second upper barrier layer 15-2'. Next, the second upper barrier layer 15-2' is patterned as the p-type low-resistance region 15g' by anisotropic etching using the resist pattern 27 as a mask. After the patterning is completed, the resist pattern 27 is removed.

Subsequently, as shown in FIG. 17, the gate insulating layer 18 made of aluminum oxide is formed on the first upper barrier layer 15-1 so as to cover the second upper barrier layer 15-2' to be the low-resistance region 15g'. Next, the gate electrode 19' is formed by patterning above the second upper barrier layer 15-2' through the gate insulating layer 18, and the source opening 18s/drain opening 18d are formed in the insulating layer 18, then, the source electrode 17s/drain electrode 17d are formed to complete the semiconductor device 1-9.

<Advantages of Semiconductor Device of Ninth Embodiment>

The semiconductor device 1-9 explained above has the structure in which the second upper barrier layer 15-2' to be the p-type low-resistance region 15g' is provided above the n-type high-resistance region 15b' not containing an impurity or with low concentration and the gate electrode 19' is provided above the second upper barrier layer 15-2' through the gate insulating layer 18. Therefore, it is possible to improve the maximum drain current Idmax by preventing gate leakage current as well as to downsize the device and to reduce parasitic capacitance with respect to the device in the same manner as the semiconductor device according to the first embodiment.

Additionally, the semiconductor device 1-9 according to the ninth embodiment particularly uses the second upper barrier layer 15-2' formed by epitaxial growth and patterned as the p-type low-resistance region 15g'. Accordingly, the thickness of the low-resistance region 15g' can be controlled with high accuracy. As a result, it is possible to stabilize the threshold voltage, the on-resistance Ron and the maximum drain current Idmax as compared with the structure of having the low-resistance region formed by diffusing the impurity.

The structure of the semiconductor device according to the ninth embodiment can be combined with the semiconductor device having the structure in which the insulating layer 16 is provided in addition to the gate insulating layer 18 as explained in the first to fifth embodiments. As a manufacturing method in this case, after the low-resistance region 15g' made of the second upper barrier layer 15-2' is formed by patterning as shown in FIG. 18B, the insulating layer 16 is formed and the gate opening 16g is formed therein in the same manner explained with reference to FIG. 5B. After that, the gate insulating layer 18 is formed, then, the source electrode 17s/drain electrode 17d and the gate electrode 19' are formed.

10. Tenth Embodiment

Figure 19:
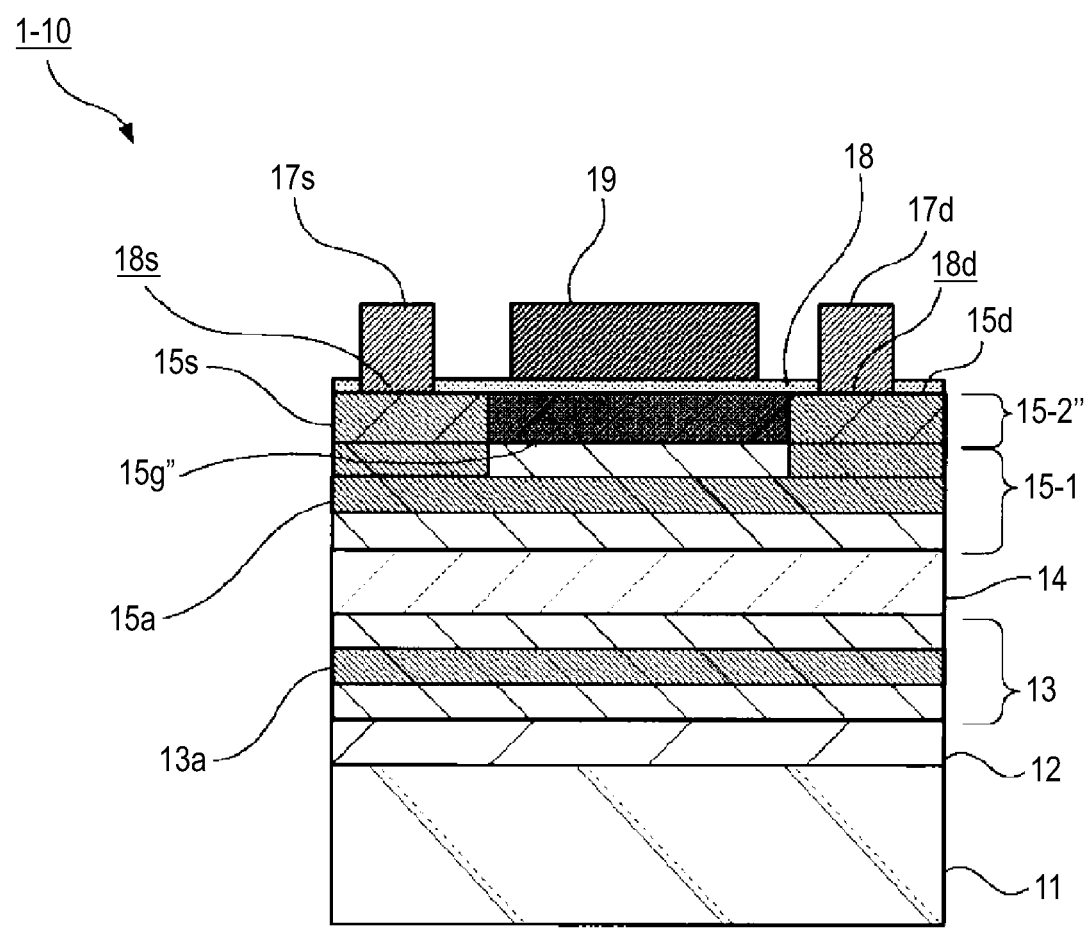
FIG. 19 is a cross-sectional view showing a structure of a relevant part of a semiconductor device according to a tenth embodiment.

Example in which Source Region/Drain Region of a Conductive Type Reverse to the Low-Resistance Region FIG. 19 is a cross-sectional view showing a structure of a relevant part of a semiconductor device according to a tenth embodiment. Hereinafter, the structure of the semiconductor device according to the tenth embodiment to which the present disclosure is applied will be explained with reference to the drawing.

<Structure of Semiconductor Device in Tenth Embodiment>

A semiconductor device 1-10 according to the tenth embodiment shown in FIG. 19 differs from the semiconductor device of the first embodiment explained with reference to FIG. 1 in a point that the upper barrier layer has a stacked structure of the first upper barrier layer 15-1 and a second upper barrier layer 15-2". The semiconductor device 1-10 also differs in points that n-type source region 15s/drain region 15d are provided in the first upper barrier layer 15-1 and the second upper barrier layer 15-2", the whole surface of the upper barrier layer of the stacked structure is covered with the gate insulating layer 18 and the insulating layer 16 below the gate insulating layer 18 is removed. Other components are the same. Therefore, the same numerals and signs are given to the same components as the first embodiment and the detailed explanation in the present embodiment is omitted.

The first upper barrier layer 15-1 is the layer so as to touch the channel layer 14, which is formed in the same manner as the upper barrier layer 15 of the first embodiment. However, the whole region of the first upper barrier layer 15-1 can be formed as the carrier supply region 15a and the low-resistance region is not provided, which are different from the upper barrier layer according to the first embodiment.

Particularly, the second upper barrier layer 15-2" is a layer formed above the channel layer 14 through the first upper barrier layer 15-1, which forms the upper barrier layer together with the first upper barrier layer 15-1. The second upper barrier layer 15-2" is configured so that a portion below the gate electrode 19 is formed as a low-resistance region 15g" containing the p-type impurity.

The second upper barrier layer 15-2" having the above structure is formed by using a compound semiconductor material having lattice matching with the first upper barrier layer 15-1, and it is not necessary that a bandgap of the material corresponds to the bandgap of the first upper barrier layer 15-1.

The above second upper barrier layer 15-2" is made of, for example, AlGaAs mixed crystal in the same manner as the first upper barrier layer 15-1. Particularly, a portion forming the low-resistance region 15g" contains at least one kind of beryllium (Be), carbon (C), magnesium (Mg) and zinc (Zn) as the p-type impurity.

In the first upper barrier layer 15-1 and the second upper barrier layer 15-2", the source region 15s/drain region 15d which are low resistant regions containing an n-type impurity are provided at positions sandwiching the gate electrode 19, namely, at positions sandwiching the p-type low-resistance region 15g". The source region 15s/drain region 15d reach the n-type carrier supply region 15a provided in the first upper barrier layer 15-1.

The whole surface of the second upper barrier layer 15-2" is covered with the gate insulating layer 18. The source opening 18s/drain opening 18d reaching the source region 15s/drain region 15d arranged so as to sandwich the low-resistance region 15g" are provided with respect to the gate insulating layer 18. The source electrode 17s and the drain electrode 17d connected to the source region 15s/drain region 15d through the source opening 18s/drain opening 18d are provided above the second upper barrier layer 15-2".

The gate electrode 19 is provided above the low-resistance region 15g" in the second upper barrier layer 15-2" through the gate insulating layer 18.

<Operation of Semiconductor Device in Tenth Embodiment>

The semiconductor device 1-10 having the above structure operates in the same manner as the semiconductor device according to the first embodiment.

<Manufacturing Method of Semiconductor Device in Tenth Embodiment>

Next, an example in which a manufacturing method of a semiconductor device 1-10 having the above structure will be explained based on cross-sectional process views of FIGS. 20A and 20B.

[FIG. 20A]

Figure 20A:
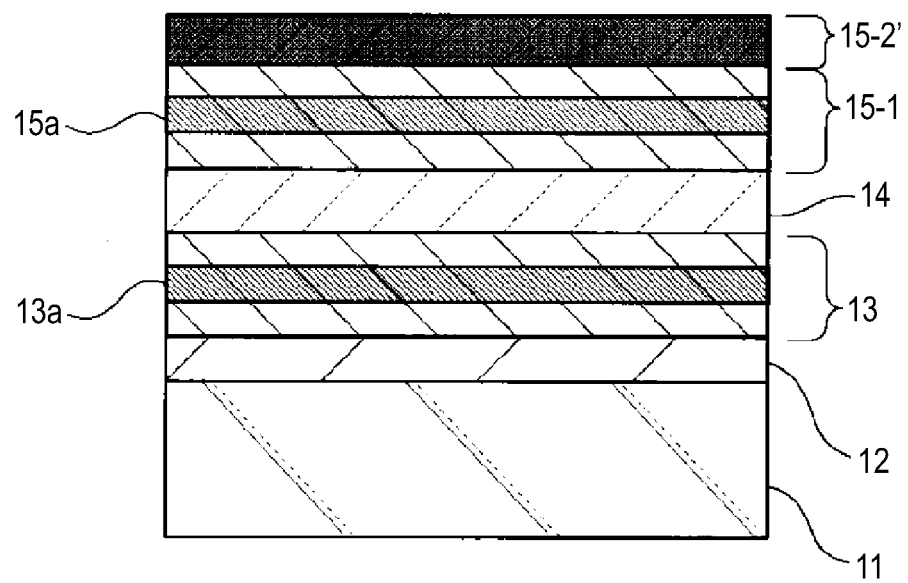
FIGS. 20A and 20B are cross-sectional process views showing manufacturing procedures of the semiconductor device according to the tenth embodiment.

First, as shown in FIG. 20A, the buffer layer 12, the lower barrier layer 13, the channel layer 14 and the first upper barrier layer 15-1 are formed in this order on the substrate 11 by epitaxial growth. The processes so far are performed in the same procedures as explained in the first embodiment with reference to FIG. 5A. Subsequently, for example, the AlGaAs ($Al_{0.2}Ga_{0.8}As$ mixed crystal) layer to which at least one kind of beryllium (Be), carbon (C), magnesium (Mg) and zinc (Zn) is added as the p-type impurity is grown by the epitaxial technology to thereby form the second upper barrier layer 15-2" over the first upper barrier layer 15-1. Next, a deactivated region which has become high resistance by ion implantation such as boron is formed to be the element isolation region not shown here.

[FIG. 20B]

Figure 20B:
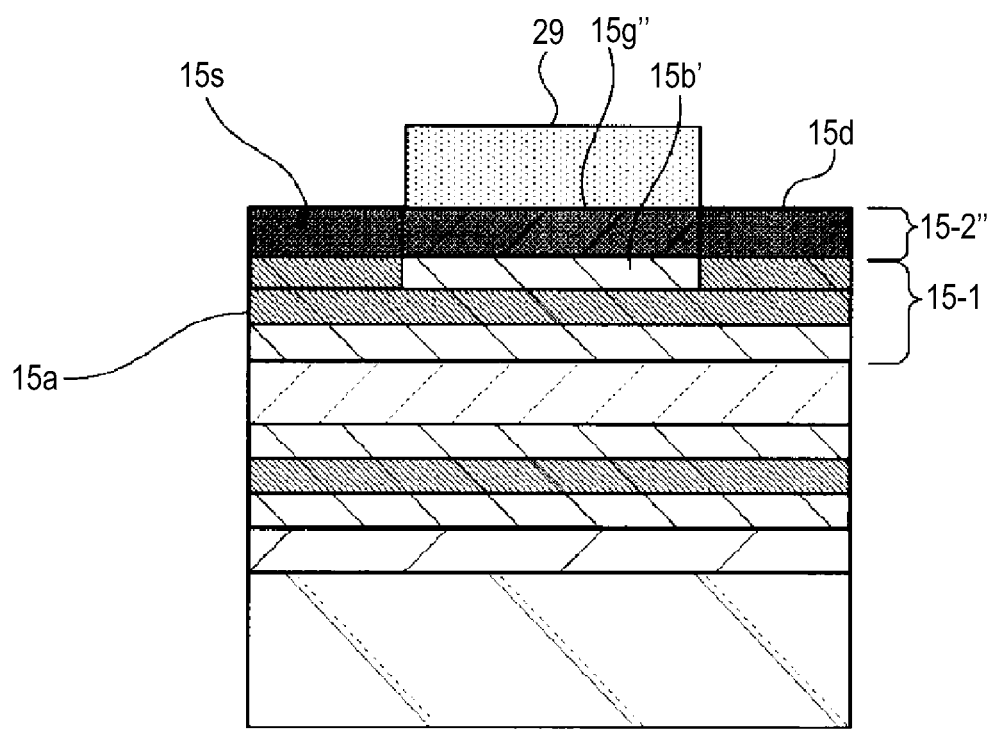

Next, as shown FIG. 20B, a resist pattern 29 is formed by applying the lithography method on a predetermined region to be the p-type low-resistance region 15g" on the second upper barrier layer 15-2". Next, an n-type impurity is implanted into the p-type second upper barrier layer 15-2" and the high-resistance region 15b' of the first upper barrier layer 15-1 below the second upper barrier layer 15-2" by impurity diffusion by using the resist pattern 29 as a mask. Accordingly, the n-type source region 15s/drain region 15d reaching the n-type carrier supply region 15a are formed at both sides of the p-type low-resistance region 15g". The impurity diffusion is performed by, for example, ion implantation. After the impurity diffusion, the resist pattern 29 is removed.

Subsequently, as shown in FIG. 19, the gate insulating layer 18 made of aluminum oxide is formed on the second upper barrier layer 15-2" in which the p-type low-resistance region 15g" and the n-type source region 15s/drain region 15d are formed. Next, the gate electrode 19 is formed by patterning above the p-type low-resistance region 15g" through the gate insulating layer 18. The source opening 18s/drain opening 18d reaching the n-type source region 15s/drain region 15d are formed in the gate insulating layer 18. After that, the source electrode 17s/the drain electrode 17d connected to the source region 15s/drain region 15d through the source opening 18s/drain opening 18d are formed to complete the semiconductor device 1-10.

<Advantages of Semiconductor Device of Tenth Embodiment>

The semiconductor device 1-10 explained above has the structure in which the gate electrode 19 is provided over the p-type low-resistance region 15g" sandwiched between the n-type source region 15s and the drain region 15d through the gate insulating layer 18. Therefore, it is possible to improve the maximum drain current Idmax by preventing gate leakage current as well as to downsize the device and to reduce parasitic capacitance with respect to the device in the same manner as the semiconductor device according to the first embodiment.

Additionally, the semiconductor device 1-10 according to the tenth embodiment is particularly provided with the n-type source region 15s/the drain region 15d so as to sandwich the p-type low-resistance region 15g", thereby increasing the sheet carrier density in the channel layer 14 just below the n-type source region 15s/the drain region 15d as well as reducing channel resistance and access resistance. That is, the on-resistance Ron can be reduced and the maximum drain current Idmax can be increased.

Furthermore, the second upper barrier layer 15-2" formed by epitaxial growth is used as the p-type low-resistance region 15g". Accordingly, the thickness of the low-resistance region 15g" is controlled with high accuracy. As a result, it is possible to stabilize the threshold voltage, the on-resistance Ron and the maximum drain current Idmax as compared with the structure of having the low-resistance region formed by diffusing the impurity.

The structure of the semiconductor device according to the tenth embodiment can be combined with the semiconductor device having the structure in which the insulating layer 16 is provided in addition to the gate insulating layer 18 as explained in the first to fifth embodiments. As a manufacturing method in this case, after the source region 15s and the drain region 15d are formed as shown in FIG. 20B and the resist pattern 29 is removed, the insulating layer 16 is formed and the gate opening 16g is formed therein in the same manner explained by using FIG. 5B. After that, the gate insulating layer 18 is formed, then, the source electrode 17s/drain electrode 17d and the gate electrode 19 are formed.

11. Modification Example

In the first to tenth embodiments explained as the above, respective layers using compound semiconductors formed above the substrate 11 have lattice matching with respective layers. However, the present disclosure is not limited to the above structures and, as respective layers using compound semiconductors formed above the substrate 11, a compound semiconductor layer grown by a pseudomorphic technology or compound semiconductor layers having different lattice constants grown by a metamorphic technology can be used. Addition For example, a configuration example using the metamorphic technology is as follows:

Substrate 11 and Buffer layer 12 . . . GaAs
Lower barrier layer . . . InAlAs ($In_{0.52}Al_{0.48}As$)
Channel layer . . . InGaAs ($In_{0.53}Ga_{0.47}As$)
Upper barrier layer (or First upper barrier layer). InAlAs ($In_{0.52}Al_{0.48}As$)

12. Application Example

Wireless Communication Device

The semiconductor devices explained in respective embodiments are used for, for example, a wireless communication device in a mobility communication system and so on, particularly, used for an antenna switch for the device. The advantages are particularly effective for the wireless communication devices in which a communication frequency is higher than UHF (ultra high frequency).

That is, the semiconductor devices explained in the first to tenth embodiments having high the maximum drain current Idmax and excellent harmonic distortion characteristics are used for the antenna switch of the wireless communication device, thereby downsizing the wireless communication device and reducing power consumption. Particularly in a portable communication terminal, portability can be improved due to extension of operation time by downsizing the device as well as reducing power consumption.

The present disclosure can apply the following configurations.

(1) A semiconductor device including
a channel layer made of a compound semiconductor,
a barrier layer provided above the channel layer and made of a compound semiconductor in which an energy band on a carrier travel side in a junction with respect to the channel layer is farther from an intrinsic Fermi level in the channel layer than in the channel layer,
a low-resistance region provided in a surface layer of the barrier layer, in which resistance is kept lower than portions around by containing impurity,
a source electrode and a drain electrode connected to the barrier layer at positions sandwiching the low-resistance region,
a gate insulating layer provided on the low-resistance region, and
a gate electrode provided above the low-resistance region through the gate insulating layer.

(2) The semiconductor device described in the above (1),
in which the barrier layer has a stacked structure of a first barrier layer touching the channel layer and a second barrier layer in which diffusion velocity of the impurity contained in the low-resistance region is slower than the first barrier layer, and
the low-resistance region is provided in the second barrier layer.

(3) The semiconductor device described in the above (1) or (2),
in which another barrier layer made of a compound semiconductor in which an energy band on a carrier travel side in a junction with respect to the channel layer is farther from an intrinsic Fermi level in the channel layer than in the channel layer is arranged at a position where the channel layer is sandwiched between the barrier layer and another barrier layer.

(4) The semiconductor device described in any of the above (1) to (3),
in which a layer containing impurity of a conductive type reverse to the low-resistance region is provided between the barrier layer and the source electrode/drain electrode.

(5) The semiconductor device described in any of the above (1) to (4),
in which the barrier layer has a stacked structure of a first barrier layer touching the channel layer and a second barrier layer formed by patterning on the first barrier layer.

(6) The semiconductor device described in any of the above (1) to (5),
in which the gate electrode has a shape completely covering an upper portion of the low-resistance region.

(7) The semiconductor device described in any of the above (1) to (6),
in which electrons inside the channel layer are depleted by applying a negative voltage to the gate electrode, and
the depletion occurs in the low-resistant region by applying a positive voltage to the gate electrode.

(8) The semiconductor device described in any of the above (1) to (7),
in which the gate insulating layer is formed by using an oxide or a nitride.

(9) The semiconductor device described in any of the above (1) to (8),
in which the channel layer is made of InGaAs mixed crystal as a III-V group compound semiconductor, and
the barrier layer is made of AlGaAs mixed crystal as a III-V group compound semiconductor.

(10) The semiconductor device described in any of the above (1) to (9),
in which the low-resistance region contains at least one kind of beryllium, carbon, magnesium and zinc as the impurity.

(11) The semiconductor device described in any of the above (1) to (8),
in which the channel layer is made of InGaAs mixed crystal as the III-V group compound semiconductor, and
the barrier layer is made of In(AlGa)AsP mixed crystal as a III-V group compound semiconductor.

(12) The semiconductor device described in any of the above (1) to (11),
in which the channel layer is provided on a substrate made of GaAs.

(13) The semiconductor device described in the above (12),
in which the channel layer is formed by a compound semiconductor having a lattice constant different from GaAs being metamorphically grown on the substrate.

(14) The semiconductor device described in any of the above (1) to (11),
in which the channel layer is provided on a substrate made of InP.

(15) A manufacturing method of a semiconductor device including
forming a barrier layer above a channel layer made of a compound semiconductor, which is made of a compound semiconductor in which an energy band on a carrier travel side in a junction with respect to the channel layer is farther from an intrinsic Fermi level in the channel layer than in the channel layer and which includes a low-resistance region containing an impurity in a surface layer,
forming a source electrode and a drain electrode at respective positions sandwiching the low-resistance region on the barrier layer,
forming a gate insulating layer on the low-resistance region and
forming a gate electrode above the low-resistance region through the gate insulating layer.

(16) The manufacturing method of the semiconductor device described in the above (15),
in which the gate insulating layer is deposited by using an atomic layer deposition method when forming the gate insulating layer.

(17) The manufacturing method of the semiconductor device described in the above (15) or (16),
in which, after depositing the barrier layer made of the compound semiconductor, the low-resistance region is formed by diffusing an impurity into the surface layer of the barrier layer when forming the barrier layer.

(18) The manufacturing method of the semiconductor device described in the above (17),
in which zinc is diffused as the impurity.

(19) The manufacturing method of the semiconductor device described in the above (15) or (16),
in which, after forming a first barrier layer made of a compound semiconductor in which an energy band on a carrier travel side in a junction with respect to the channel layer is farther from an intrinsic Fermi level in the channel layer than in the channel layer, a second barrier layer made of a compound semiconductor in which diffusion velocity of the impurity is slower than the first barrier layer is formed, then, the low-resistance region is formed by diffusing the impurity with respect to the second barrier layer when forming the barrier layer.

(20) The manufacturing method of the semiconductor device described in the above (15) or (16),
in which, after forming the first barrier layer on the channel layer, the second barrier layer is formed on the first barrier layer by epitaxial growth to which an impurity is added, and the second barrier layer is used as the low-resistance region when forming the barrier layer.

The present disclosure contains subject matter related to that disclosed in Japanese Priority Patent Applications JP 2011-165873 and JP 2012-126040 filed in the Japan Patent Office on Jul. 28, 2011 and Jun. 1, 2012, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
an undoped group III-V compound channel layer between a group III-V compound semiconductor upper barrier layer and a group III-V compound semiconductor lower barrier layer;
a carrier supply region of the group III-V compound semiconductor upper barrier layer between a first high-resistance region of the group III-V compound semiconductor upper barrier layer and a second high-resistance region of the group III-V compound semiconductor upper barrier layer;
a low-resistance region of a first conductivity-type in the first high-resistance region, the first conductivity-type being opposite to a second conductivity-type;
a source region of the second conductivity-type in the first high-resistance region, a source electrode and the low-resistance region touching the source region;
a drain region of the second conductivity-type in the first high-resistance region, a drain electrode and the low-resistance region touching the drain region;
a gate insulating layer between a gate electrode and the low-resistance region, the gate insulating layer physically isolating the gate electrode from the low-resistance region,
wherein the second high-resistance region is between the carrier supply region and the undoped group III-V compound channel layer.

2. The semiconductor device according to claim 1, wherein the first conductivity-type is p-type.

3. The semiconductor device according to claim 1, wherein the second conductivity-type is n-type.

4. The semiconductor device according to claim 1, wherein the low-resistance region is between the source region and the drain region.

5. The semiconductor device according to claim 1, wherein the undoped group III-V compound channel layer contains indium, gallium, and arsenide.

6. The semiconductor device according to claim 1, wherein the group III-V compound semiconductor upper barrier layer contains aluminum, gallium, and arsenide.

7. The semiconductor device according to claim 6, wherein the group III-V compound semiconductor upper barrier layer contains indium and phosphorus.

8. The semiconductor device according to claim 1, wherein the source electrode is made of an alloy of gold-germanium (AuGe), nickel (Ni) and gold (Au) which are sequentially stacked in this order from the group III-V compound semiconductor upper barrier layer.

9. The semiconductor device according to claim 1, wherein the drain electrode is made of an alloy of gold-germanium (AuGe), nickel (Ni) and gold (Au) which are sequentially stacked in this order from the group III-V compound semiconductor upper barrier layer.

10. The semiconductor device according to claim 1, wherein the gate electrode has a structure in which titanium (Ti), platinum (Pt) and gold (Au) are sequentially stacked in this order from the group III-V compound semiconductor upper barrier layer.

11. The semiconductor device according to claim 1, wherein the first high-resistance region and the second high-resistance region touch the carrier supply region.

12. The semiconductor device according to claim 1, wherein the gate insulating layer touches the gate electrode and the low-resistance region.

13. The semiconductor device according to claim 1, wherein the source electrode and the drain electrode are on a surface of the group III-V compound semiconductor upper barrier layer.

14. The semiconductor device according to claim 13, wherein the gate insulating layer is on the surface of the group III-V compound semiconductor upper barrier layer.

15. The semiconductor device according to claim 1, wherein the second high-resistance region is of the first conductivity-type.

16. The semiconductor device according to claim 15, wherein the carrier supply region is of the second conductivity-type.

17. The semiconductor device according to claim 1, wherein the second high-resistance region is of the second conductivity-type.

18. The semiconductor device according to claim 17, wherein the carrier supply region is of the second conductivity-type.

19. The semiconductor device according to claim 1, wherein the second high-resistance region is undoped.

20. The semiconductor device according to claim 19, wherein the carrier supply region is of the second conductivity-type.

* * * * *